US010356353B2

(12) United States Patent
Okura et al.

(10) Patent No.: US 10,356,353 B2
(45) Date of Patent: Jul. 16, 2019

(54) SOLID-STATE IMAGING DEVICE, METHOD FOR DRIVING SOLID-STATE IMAGING DEVICE, AND ELECTRONIC APPARATUS

(71) Applicants: Brillnics Japan Inc., Tokyo (JP); The Ritsumeikan Trust, Kyoto-shi, Kyoto (JP)

(72) Inventors: Shunsuke Okura, Tokyo (JP); Masato Yamaguchi, Tokyo (JP); Masayoshi Shirahata, Kusatsu (JP); Takeshi Fujino, Kusatsu (JP); Mitsuru Shiozaki, Kusatsu (JP); Takaya Kubota, Kusatsu (JP)

(73) Assignees: BRILLNICS JAPAN INC., Tokyo (JP); THE RITSUMEIKAN TRUST, Kyoto-shi (JP)

( * ) Notice: Subject to any disclaimer, the term of this patent is extended or adjusted under 35 U.S.C. 154(b) by 0 days.

(21) Appl. No.: 15/874,379

(22) Filed: Jan. 18, 2018

(65) Prior Publication Data
US 2018/0205901 A1    Jul. 19, 2018

(30) Foreign Application Priority Data
Jan. 19, 2017  (JP) ................................. 2017-007381

(51) Int. Cl.
*H04N 5/374*    (2011.01)
*H04N 5/357*    (2011.01)
(Continued)

(52) U.S. Cl.
CPC ......... *H04N 5/378* (2013.01); *H01L 27/1461* (2013.01); *H01L 27/14612* (2013.01);
(Continued)

(58) Field of Classification Search
CPC ............. H04N 5/2621; H04N 5/23222; H04N 5/23229; H04N 5/72; H04N 5/23293
See application file for complete search history.

(56) References Cited

U.S. PATENT DOCUMENTS

| 7,894,600 B2 * | 2/2011 | Sato ........................ G06F 21/32 356/71 |
| 2003/0056122 A1 * | 3/2003 | Wuidart .................. G06F 21/32 726/5 |
| 2018/0115723 A1 * | 4/2018 | Takayanagi ....... H01L 27/14609 |

FOREIGN PATENT DOCUMENTS

WO        2016/167076 A1    10/2016

* cited by examiner

*Primary Examiner* — Hung H Lam
(74) *Attorney, Agent, or Firm* — Westerman, Hattori, Daniels & Adrian, LLP

(57) ABSTRACT

A solid-state imaging device having a pixel portion in which a plurality of pixels each including a photodiode are arranged in rows and columns, a reading part for reading pixel signals from the pixel portion, and a key generation part which generates a unique key by using, as the key generation-use data, at least one of fluctuation information of pixels and fluctuation information of the reading part, wherein the key generation part includes a tamper resistance enhancement processing part for processing the key generation-use data to enhance the tamper resistance making it difficult to break the unique key as tamper resistance enhancement processing. Due to this, a unique key having a high confidentiality can be generated. Further, reproducibility and uniqueness of the unique ID can be improved to secure a high tamper resistance of the unique key, and tampering and forgery of an image can be reliably prevented.

16 Claims, 27 Drawing Sheets

(51) Int. Cl.
*H04N 5/378* (2011.01)
*H01L 27/146* (2006.01)
(52) U.S. Cl.
CPC .. *H01L 27/14641* (2013.01); *H01L 27/14643* (2013.01); *H04N 5/357* (2013.01); *H04N 5/374* (2013.01)

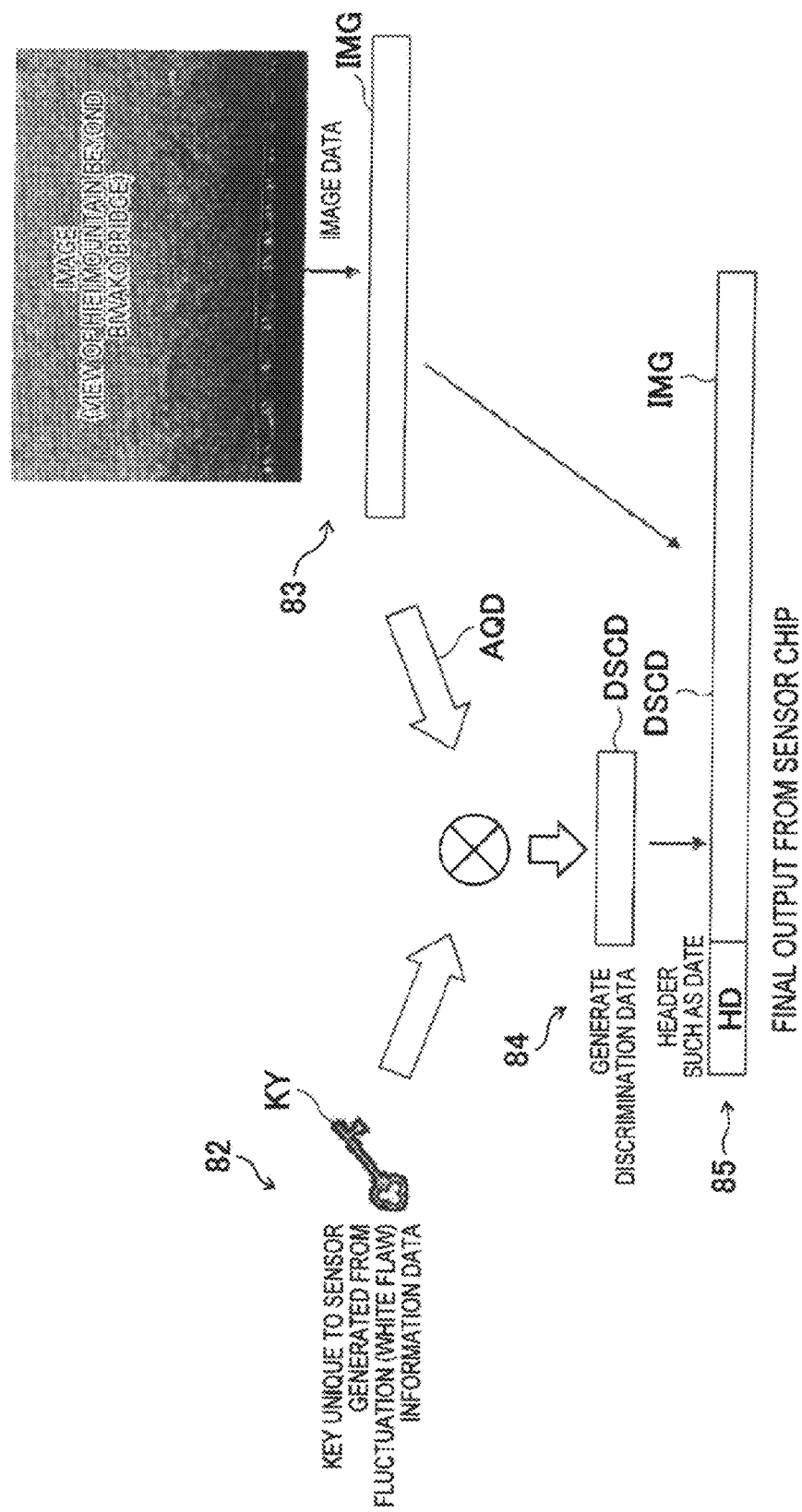

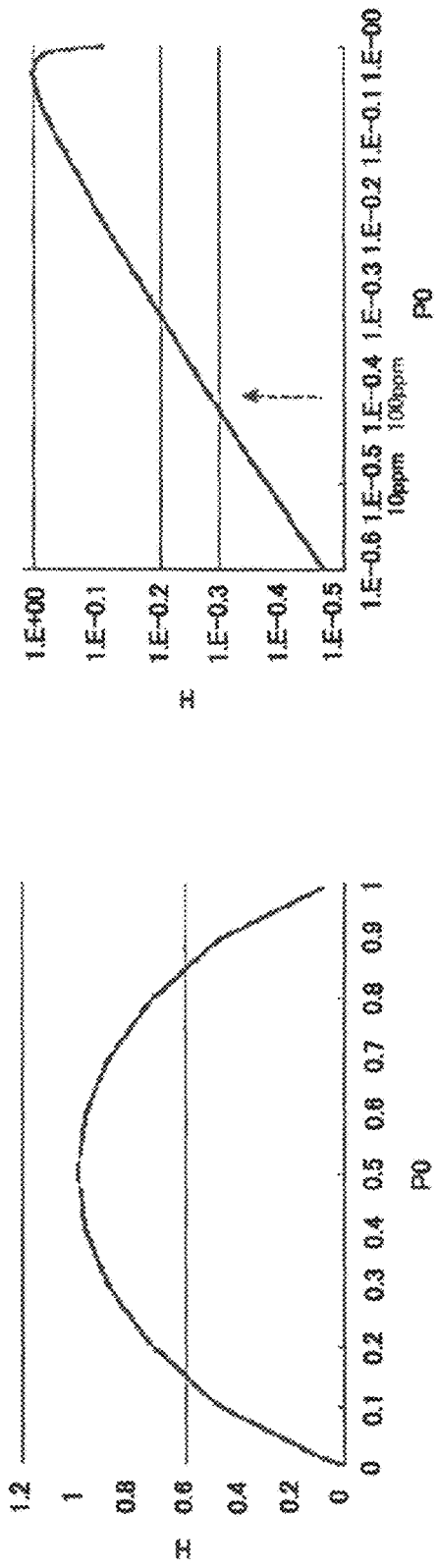

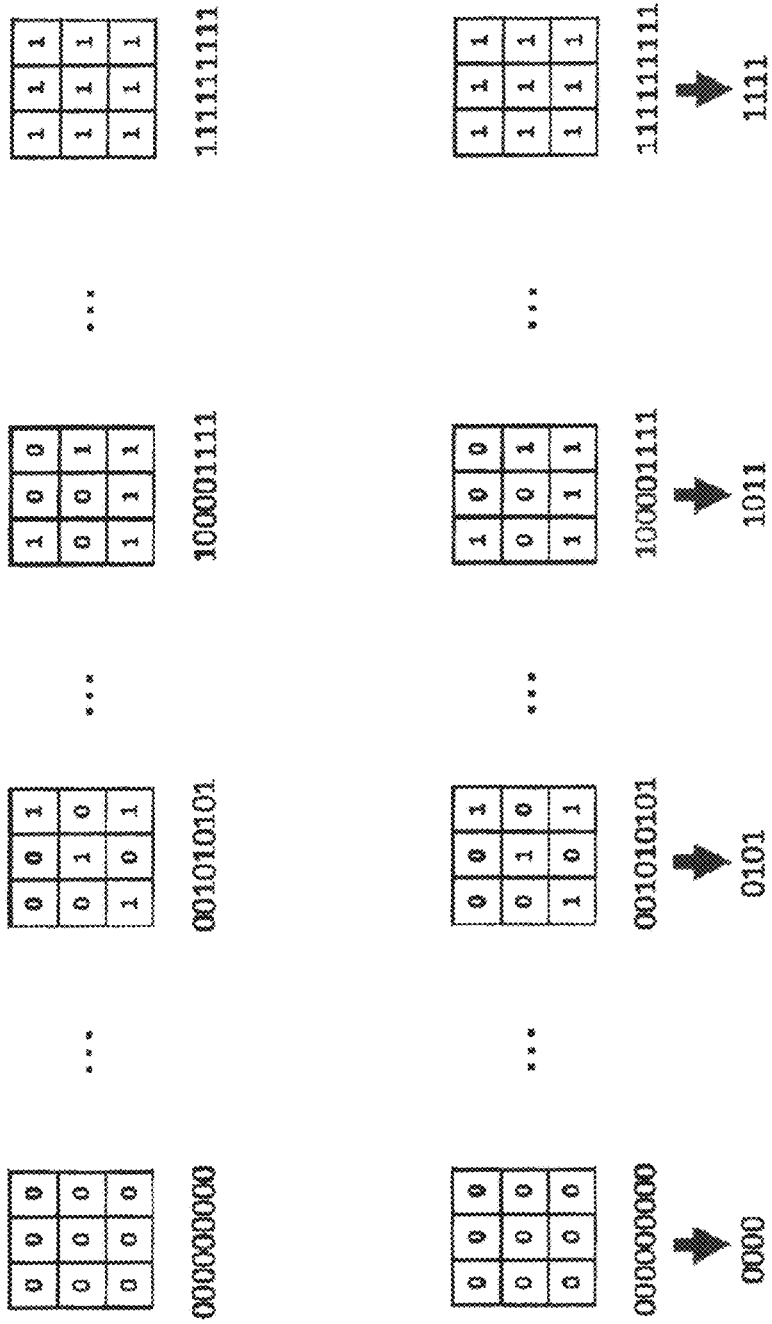

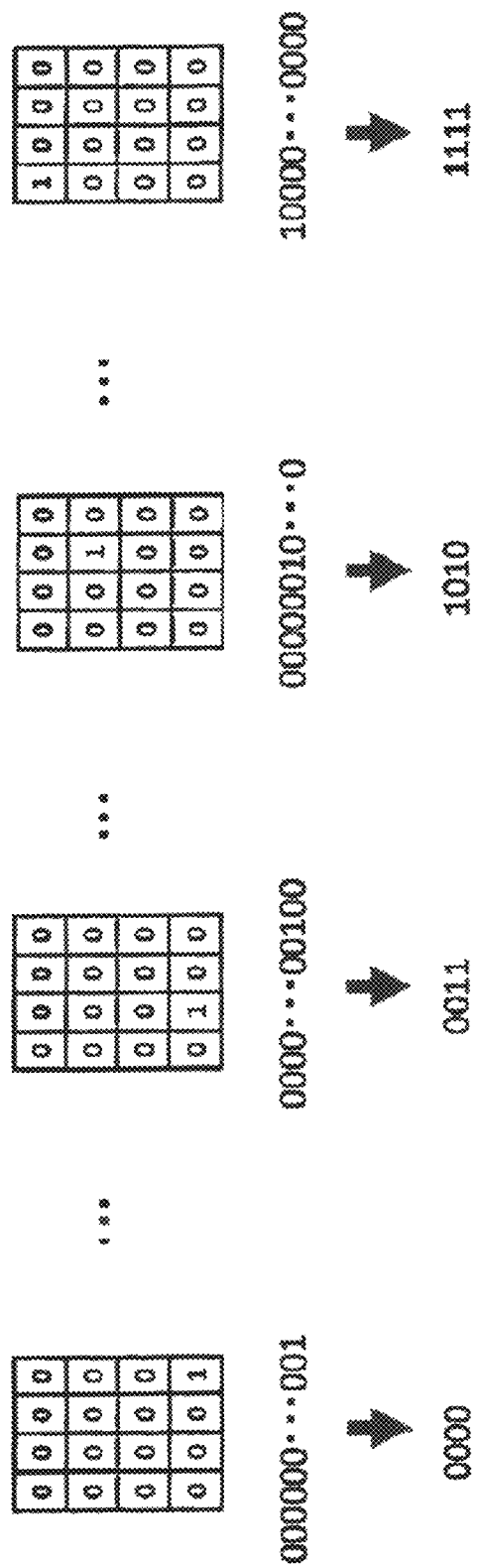

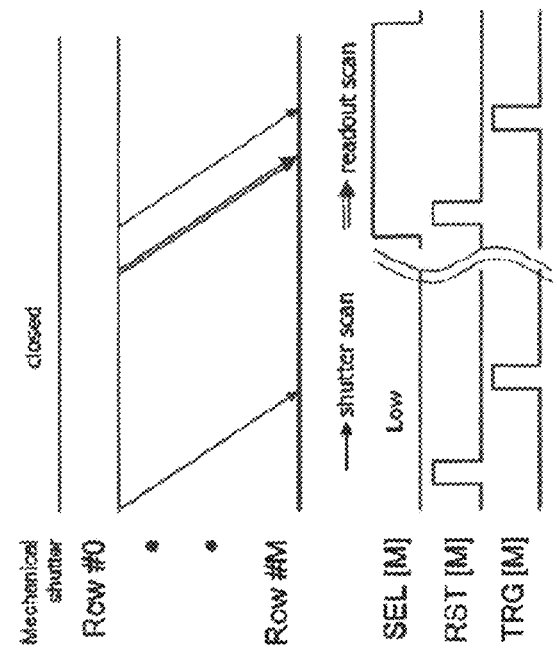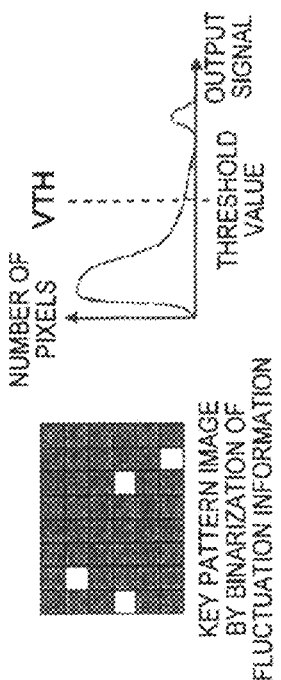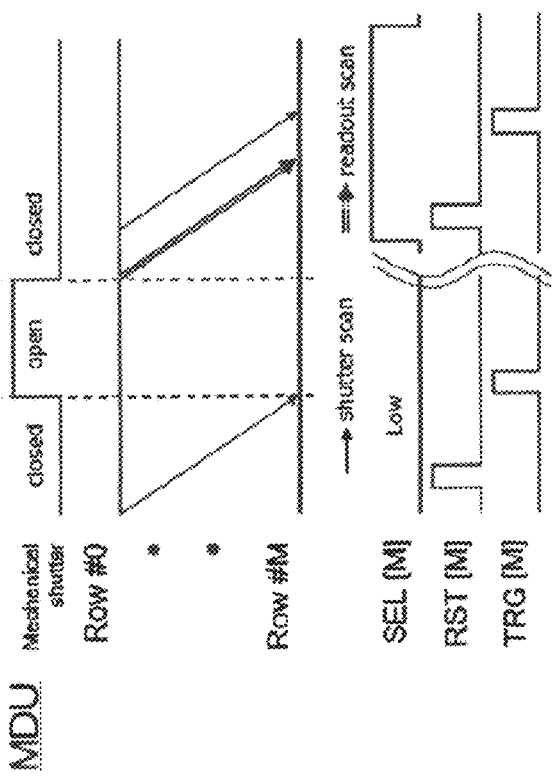

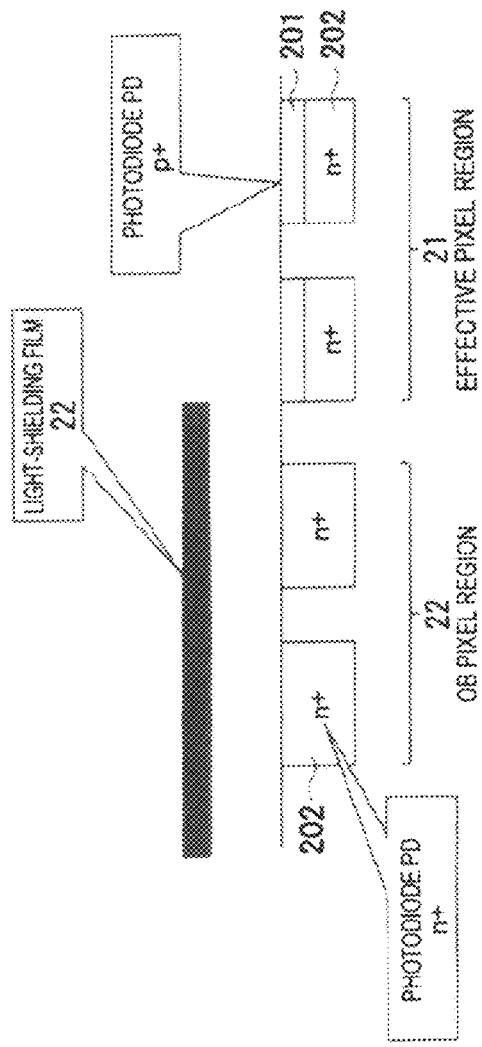
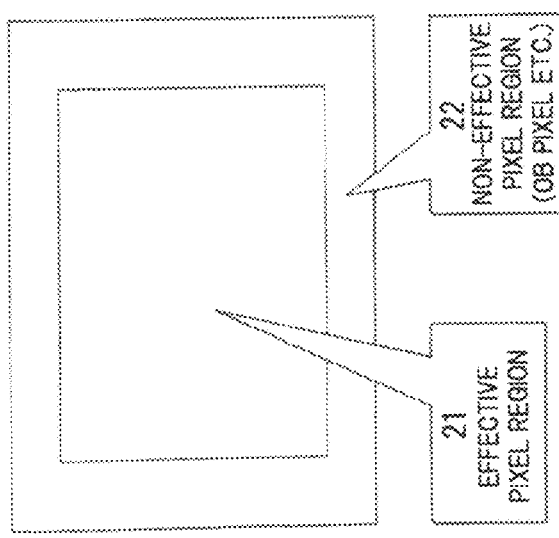

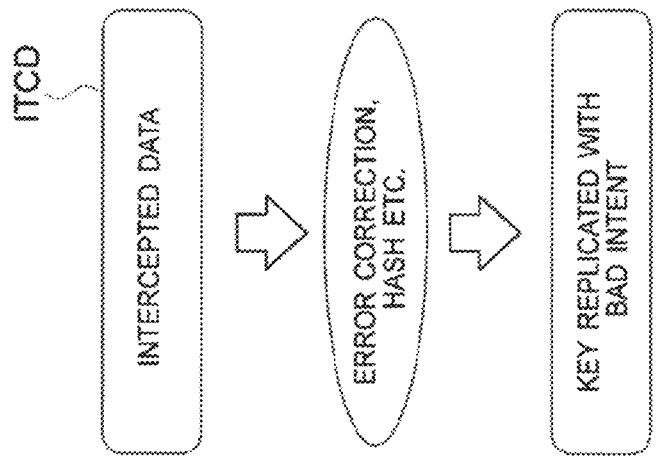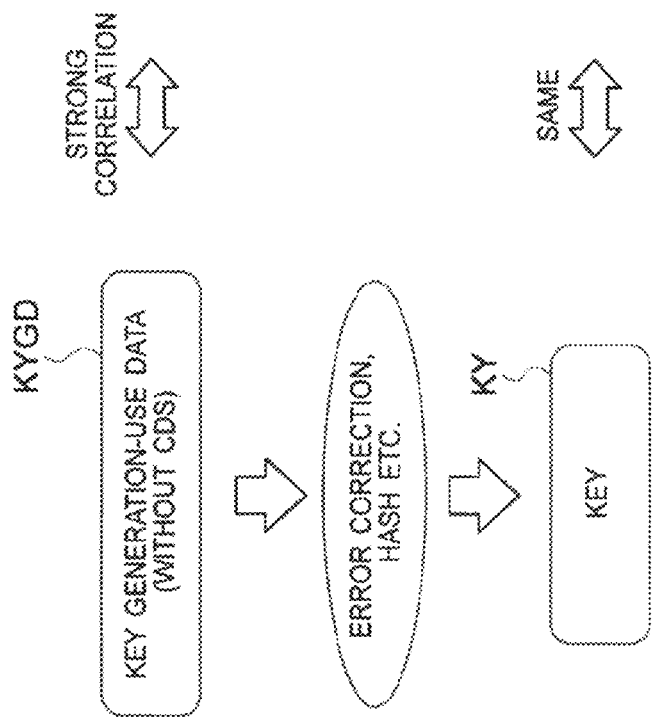

MDU
FIG. 19A SEL
FIG. 19B RST
FIG. 19C TG1
FIG. 19D TG2
FIG. 19E CLIP
FIG. 19F pixel output
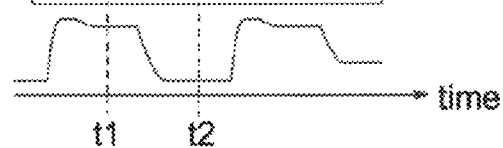
MDK
FIG. 20A SEL
FIG. 20B RST
FIG. 20C TG1
FIG. 20D TG2
FIG. 20E CLIP
FIG. 20F pixel output
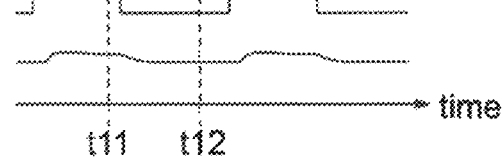

PIXEL CHARACTERISTIC FLUCTUATION DISTRIBUTION
OF ENTIRE ARRAY AND COLUMNS

OUTLINE OF SIGNAL PROCESSING

MONTE CARLO SIMULATION RESULT

CAPTURE MODE IMAGE

MDK IMAGE (BRIGHT)

MDK IMAGE (DARK)

BEFORE SIGNAL PROCESSING

AFTER SIGNAL PROCESSING

SOLID-STATE IMAGING DEVICE, METHOD FOR DRIVING SOLID-STATE IMAGING DEVICE, AND ELECTRONIC APPARATUS

CROSS-REFERENCE TO RELATED APPLICATION

The present invention contains subject matter related to Japanese Patent Application JP2017-7381 filed in the Japan Patent Office on Jan. 19, 2017, the entire contents of which being incorporated herein by reference.

TECHNICAL FIELD

The present invention relates to a solid-state imaging device, a method for driving a solid-state imaging device, and an electronic apparatus.

BACKGROUND ART

As solid-state imaging devices (image sensors) using photoelectric conversion elements which detect light to generate electric charges, CMOS (complementary metal oxide semiconductor) image sensors have been put into practical use. CMOS image sensors are being widely applied as parts of digital cameras, video cameras, monitoring cameras, medical endoscopes, personal computers (PC), mobile phones, and other portable terminal devices (mobile devices) and various other types of electronic apparatuses.

A CMOS image sensor has a floating diffusion (FD) amplifier having, for each pixel, a photodiode (photoelectric conversion element) and floating diffusion layer. For readout, the mainstream type is the column parallel output type that selects a certain row in a pixel array and simultaneously reads the pixels out to a column output direction.

Each pixel in a CMOS image sensor basically includes as active elements, for example, for one photodiode, four elements of a transfer element constituted by a transfer transistor, a reset element constituted by a reset transistor, a source-follower element (amplification element) constituted by a source-follower transistor, and a selection element constituted by a selection transistor. Further, each pixel may be provided with an overflow gate (overflow transistor) for discharging an overflow charge overflowing from the photodiode in a storage period of the photodiode.

The transfer transistor is held in a non-conductive state during a charge accumulation period of the photodiode and is supplied with a driving signal at its gate and held in a conductive state and transfers the charge photo-electrically converted in the photodiode to the floating diffusion FD during a transfer period for transferring the accumulated (stored) charge of the photodiode to the floating diffusion FD.

The reset transistor resets the potential of the floating diffusion FD to the potential of the power supply line when a reset signal is given to its gate.

The floating diffusion FD is connected the gate of the source-follower transistor. The source-follower transistor is connected through the selection transistor to a vertical signal line and configures a source-follower together with a constant current source in a load circuit outside of the pixel portion. Further, a control signal (address signal or select signal) is given to the gate of the selection transistor, whereupon the selection transistor turns ON. When the selection transistor becomes ON, the source-follower transistor amplifies the potential of the floating diffusion FD and outputs a voltage in accordance with that potential to the vertical signal line. Through the vertical signal line, the voltage output from the pixel is output to a pixel signal readout circuit constituted by a column parallel processing part. In the column parallel processing, the image data is for example converted from an analog signal to digital signal, transferred to a later stage signal processing part, and subjected to predetermined image signal processing to obtain a desired image.

As explained above, in a CMOS image sensor, electrons which are generated by photo-electric conversion by slight light are converted to voltage by a very small capacitance and further are output by using a source-follower transistor having a very small area. For this reason, it is necessary to remove very small noise such as noise generated when resetting the capacitance or manufacturing fluctuations of the transistors, therefore the difference between the reset level and the luminance level (signal level) for each pixel is output. In this way, in a CMOS image sensor, by outputting the difference between the reset level and the luminance level for each pixel, the reset noise and threshold value fluctuations are removed, therefore signals of a few electrons can be detected. The operation of detecting this difference is a technique called "correlated double sampling (CDS)" and is widely used. All of the pixels arranged in an array state are sequentially read out by CDS and 1 frame's worth of usual pixel data is output.

In this regard, in the solid-state imaging device (image sensor) explained above, basically owners of various types of electronic apparatuses or users permitted to use the same can easily reproduce captured image data and view the images. In current solid-state imaging devices, however, even in a case where the captured image data is data concerned with personal secrets, it can be easily reproduced, therefore there is the disadvantage that unauthorized use or tampering, forgery, etc. of an image end up being easy. It is possible to secure uniform secrecy by encrypting using a unique key. In actual circumstances, however, it is difficult to secure tamper resistance (difficulty of breaking) of a unique key.

Therefore, in order to solve these problems, there has been proposed a solid-state imaging device (image sensor) capable of securing tamper resistance of a unique key and consequently capable of preventing tampering and forgery of an image (see PLT 1). This PLT 1 describes a method for extracting so-called "fingerprint information" for each chip of a CMOS image sensor.

The solid-state imaging device (image sensor) disclosed in PLT 1 basically has a pixel portion in which a plurality of pixels each including a photodiode are arranged in rows and columns, a reading part for reading pixel signals from the pixel portion, and a key generation part which generates a unique key by using at least one of fingerprint information constituted by fluctuation information of pixels and fluctuation information of the reading part.

CITATION LIST

Patent Literature

PLT 1: WO2016/167076

SUMMARY OF INVENTION

Technical Problem

In the solid-state imaging device disclosed in PLT 1, however, there remain several issues in the method for preparing the unique key from the fingerprint information.

First, if data strongly correlated with the data for key generation falls into the wrong hands, the possibility arises that the key can be reproduced by using error correction, therefore the confidentiality of the key is not secured. That is, in the solid-state imaging device disclosed in PLT 1, there is an issue in the generation of a unique key having a high confidentiality.

Second, in the solid-state imaging device disclosed in PLT 1, there is a roan for improvement in the reproducibility and uniqueness of the unique ID. Specifically, there still remains room for improvement in the reproducibility with respect to noise and the uniqueness with respect to a pattern having a low spatial frequency.

The present invention aims to provide a solid-state imaging device capable of generating a unique key having a high confidentiality and capable of improving the reproducibility and uniqueness of the unique ID and securing a high tamper resistance of the unique key and consequently capable of reliably preventing tampering and forgery of an image, a method for driving a solid-state imaging device, and an electronic apparatus.

Solution to Problem

A solid-state imaging device of a first aspect of the present invention has a pixel portion in which a plurality of pixels each including a photodiode are arranged in rows and columns, a reading part for reading pixel signals from the pixel portion, and a key generation part which generates a unique key by using, as key generation-use data, at least one of fluctuation information of the pixels and fluctuation information of the reading part, wherein the key generation part includes a tamper resistance enhancement processing part for processing the key generation-use data to enhance the tamper resistance for making the unique key difficult to break as tamper resistance enhancement processing.

A second aspect of the present invention is a method for driving a solid-state imaging device including a pixel portion in which a plurality of pixels each including a photodiode are arranged in rows and columns and a reading part for reading pixel signals from the pixel portion, comprising an information acquisition step of acquiring at least one information of fluctuation information of the pixels and fluctuation information of the reading part and a key generation step of generating a unique key by using the fluctuation information acquired in the information acquisition step as key generation-use data and, in the key generation step, processing the key generation-use data for enhancing the tamper resistance for making the unique key difficult to break as tamper resistance enhancement processing.

An electronic apparatus of a third aspect of the present invention has a solid-state imaging device and an optical system for forming a subject image in the solid-state imaging device, wherein the solid-state imaging device has a pixel portion in which a plurality of pixels each including a photodiode are arranged in rows and columns, a reading part for reading pixel signals from the pixel portion, and a key generation part which generates a unique key by using, as key generation-use data, at least one of fluctuation information of the pixels and fluctuation information of the reading part, and the key generation part includes a tamper resistance enhancement processing part for processing the key generation-use data to enhance the tamper resistance for making the unique key difficult to break as tamper resistance enhancement processing.

Advantageous Effects of Invention

According to the present invention, it is possible to generate a unique key having a high confidentiality and further able to improve the reproducibility and uniqueness of the unique ID, possible to secure a high tamper resistance of the unique key, and consequently possible to reliably prevent tampering and forgery of an image.

BRIEF DESCRIPTION OF DRAWINGS

FIG. 5 is a view diagrammatically showing the processing in the encryption processing system in FIG. 4.

FIG. 7A and FIG. 7B are views showing an example of the amount of information per pixel.

FIG. 8A and FIG. 8B are views for explaining the output and amount of information in a case of nine elements.

FIG. 9 is a view for explaining a biased output and amount of information in a case of 16 elements.

FIG. 10A to FIG. 10D are views showing operation waveforms etc. of principal parts in a usual operation mode and key preparation mode in a case where a leak current of a photodiode is employed as the leak current of a pixel.

FIG. 11A and FIG. 11B are views for explaining employing the information in a non-effective pixel region other than effective pixels in the pixel portion as the fluctuation information of pixels.

FIG. 13A and FIG. 13B are block diagrams for explaining issues in a method for generating a unique key.

FIG. 19A to FIG. 19F are views showing operation waveforms of principal parts in a usual operation node of a solid-state imaging device according to the second embodiment.

FIG. 20A to FIG. 20F are views showing operation waveforms of principal parts in a key preparation mode of the solid-state imaging device according to the second embodiment.

DESCRIPTION OF EMBODIMENTS

Below, embodiments of the present invention will be explained with reference to the drawings.

First Embodiment

Figure 1:
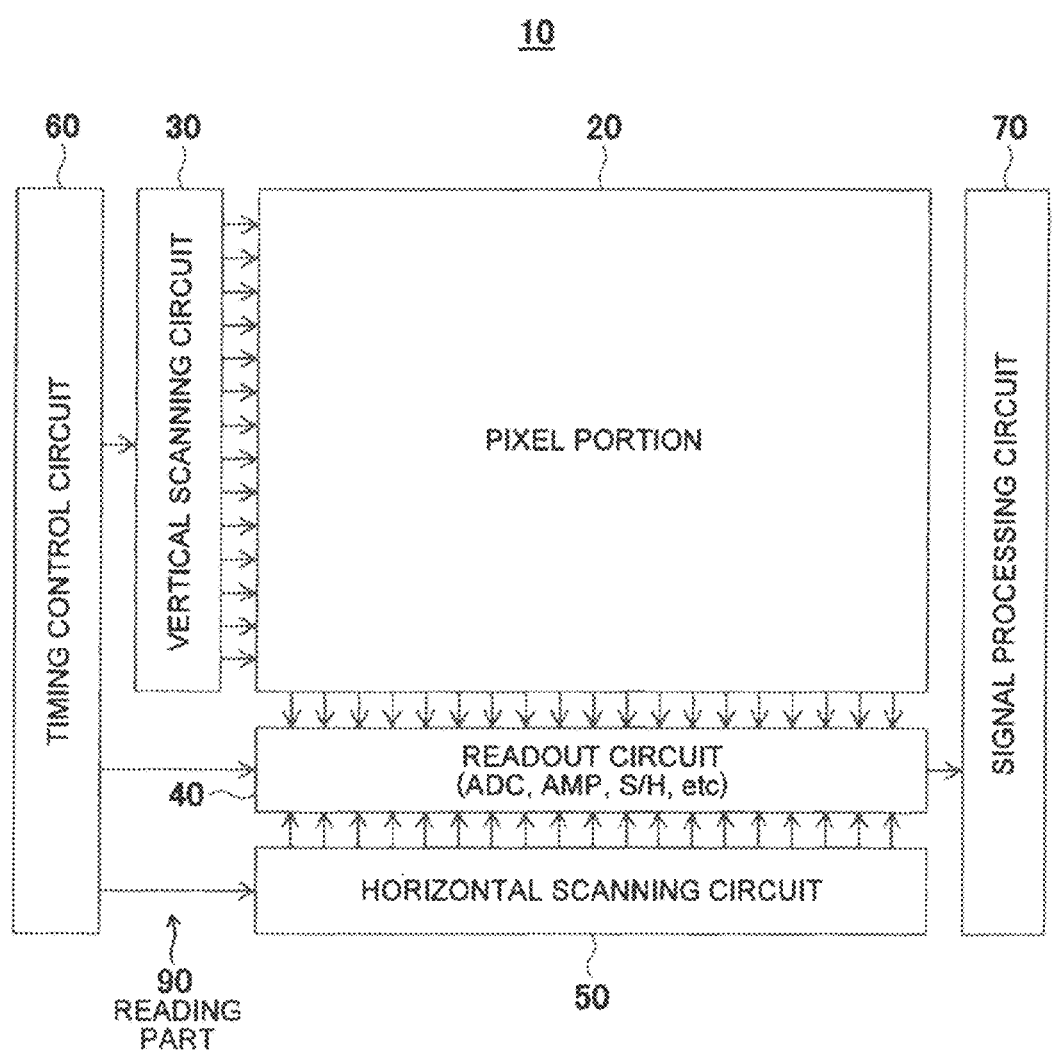
FIG. 1 is a block diagram showing an example of the configuration of a solid-state imaging device according to a first embodiment of the present invention.

FIG. 1 is a block diagram showing an example of the configuration of a solid-state imaging device according to a first embodiment of the present invention. In the present embodiment, a solid-state imaging device 10 is configured by for example a CMOS image sensor.

This solid-state imaging device 10, as shown in FIG. 1, has an imaging portion constituted by a pixel portion 20, a vertical scanning circuit (row scanning circuit) 30, a readout circuit (column readout circuit) 40, horizontal scanning circuit (column scanning circuit) 50, timing control circuit 60, and signal processing circuit 70 as the principal components. Among these components, for example, the vertical scanning circuit 30, readout circuit 40, horizontal scanning circuit 50, and timing control circuit 60 configure a reading part 90 of pixel signals.

In the present embodiment, the solid-state imaging device 10 is configured so that it can operate in a usual operation node MDU and key preparation mode MDK.

In the pixel portion 20, a plurality of pixels each including a photodiode (photo-electric conversion element) and an in-pixel amplifier are arranged in a two-dimensional matrix comprised of "n" rows and "m" columns.

Figure 2:
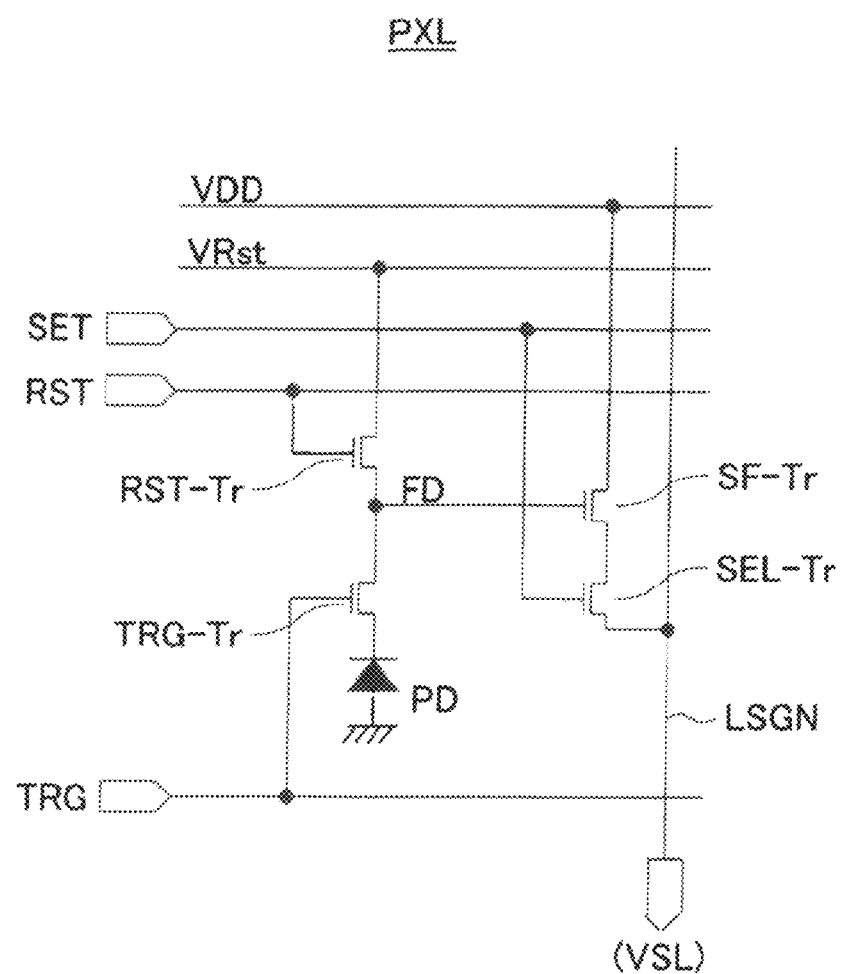
FIG. 2 is a circuit diagram showing an example of a pixel according to the first embodiment.

FIG. 2 is a circuit diagram showing an example of a pixel according to the first embodiment.

This pixel PXL has for example a photo-electric conversion element constituted by a photodiode (PD). Further, with respect to this photodiode PD, provision is made of one each of a transfer transistor TG-Tr, reset transistor RST-Tr, source-follower transistor SF-Tr, and selection transistor SEL-Tr.

The photodiode PD generates and accumulates an amount of signal charge (here, electrons) in accordance with the incident light amount. Below, a case where the signal charge is comprised of electrons and each transistor is an n-type transistor will be explained, but the signal charge may also be comprised of holes and each transistor may be p-type transistor as well. Further, the present embodiment is effective even in a case where the transistors are shared among a plurality of photodiodes or a 3-transistor (3Tr) pixel without a selection transistor is employed.

The transfer transistor TG-Tr is connected between the photodiode PD and the floating diffusion FD (floating diffusion layer) and is controlled through a control signal TG. The transfer transistor TG-Tr is selected to become a conductive state in a period where the control signal TG is high level (H) and transfers the electrons which are photo-electrically converted in the photodiode PD to the floating diffusion FD.

The reset transistor RST-Tr is connected between a power supply line VRst and the floating diffusion FD and is controlled through a control signal RST. Note that, the reset transistor RST-Tr may be configured so that it is connected between a power supply line VDD and the floating diffusion FD and is controlled through the control signal RST as well. The reset transistor RST-Tr is selected to become a conductive state in a period where the control signal RST is the H level and resets the floating diffusion FD to the potential of the power supply line VRst (or VDD).

The source-follower transistor SF-Tr and the selection transistor SEL-Tr are connected in series between the power supply line VDD and a vertical signal line LSGN. The gate of the source-follower transistor SF-Tr is connected to the floating diffusion FD, and the selection transistor SEL-Tr is controlled through a control signal SEL. The selection transistor SEL-Tr is selected to become a conductive state in a period where the control signal SEL is the H level. Due to this, the source-follower transistor SF-Tr outputs a column output analog signal VSL in accordance with the potential of the floating diffusion FD to the vertical signal line LSGN. These operations are for example carried out simultaneously in parallel for each row's worth of the pixels since for example the gates of the transfer transistors TG-Tr, reset transistors RST-Tr, and selection transistors SEL-Tr are connected in units of rows.

The pixels PXL are arranged in "n" rows and "m" columns in the pixel portion 20, therefore there are "n" control lines LSEL, LRST, and LTG and "m" vertical signal lines LSGN. In FIG. 1, the control lines LSEL, LRST, and LTG are represented as a single row scanning control line.

The vertical scanning circuit 30 drives the pixels through the row scanning control line in a shutter row and reading row according to the control of the timing control circuit 60. Further, the vertical scanning circuit 30, according to address signals, outputs row selection signals for a read row for reading the signals and for a shutter row for resetting the charges accumulated in the photodiodes PD.

The readout circuit 40 may be configured so that it includes a plurality of column signal processing circuits (not shown) which are arranged corresponding to the column outputs of the pixel portion 20 and so that column parallel processing is possible in the plurality of column signal processing circuits.

The readout circuit 40 can be configured to include a correlated double sampling (CDS) circuit or ADC (analog-to-digital converter: AD converter), amplifier (AMP), sample/hold (S/H) circuit, etc.

Figure 3A:
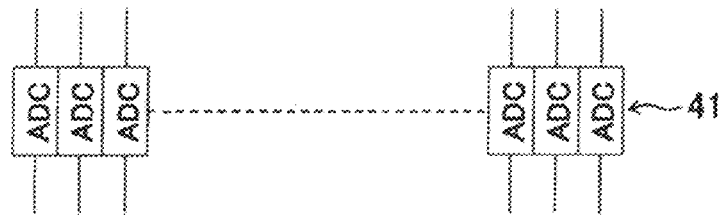
FIG. 3A to FIG. 3C are views for explaining an example of the configuration of a readout system of column output of a pixel portion in a solid-state imaging device according to an embodiment of the present invention.
Figure 3B:
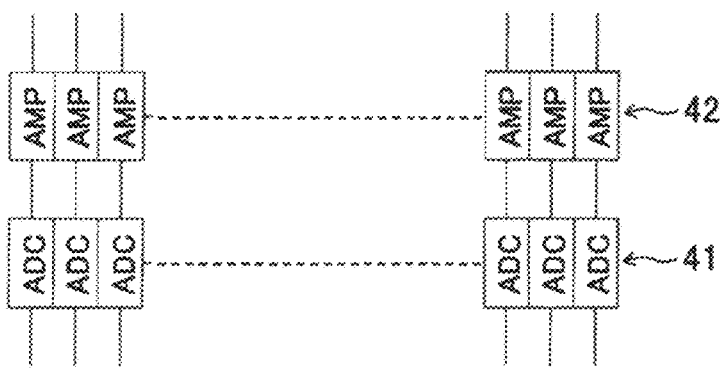
Figure 3C:
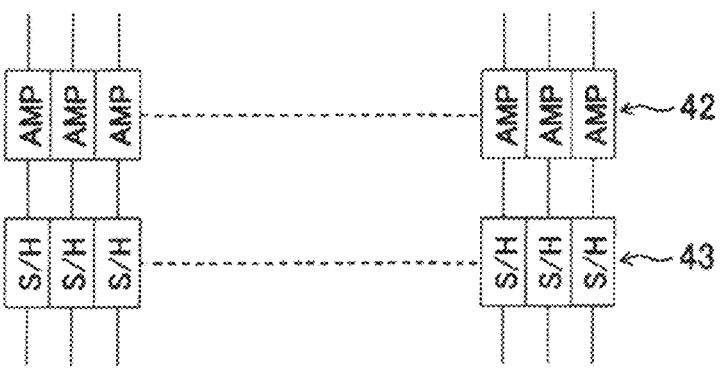

In this way, the readout circuit 40, for example as shown in FIG. 3A, may be configured as to include ADCs 41 which convert the column output analog signals VSL of the pixel portion 20 to digital signals. Alternatively, in the readout circuit 40, for example as shown in FIG. 3B, amplifiers (AMP) 42 for amplifying the column output analog signals VSL of the pixel portion 20 may be arranged. Further, in the readout circuit 40, for example as shown in FIG. 3C, sample/hold (S/H) circuits 43 for sampling and holding the column output analog signals VSL of the pixel portion 20 may be arranged. Further, in the readout circuit 40, a column memory which stores the signals obtained by applying predetermined processing to the pixel signals output from the columns of the pixel portion 20, constituted by an SRAM, may be arranged.

The horizontal scanning circuit 50 scans the signals processed in the ADCs and other plurality of column signal processing circuits in the readout circuit 40, transfers the results to the horizontal direction, and outputs the same to the signal processing circuit 70.

The timing control circuit 60 generates the timing signals which are necessary for the signal processing in the pixel portion 20, vertical scanning circuit 30, readout circuit 40, horizontal scanning circuit 50, and so on.

The signal processing circuit 70 generates two-dimensional image data by predetermined signal processing with respect to the read-out signals which are read out by the readout circuit 40 and are subjected to the predetermined processing.

As explained above, in the solid-state imaging device (CMOS image sensor), electrons generated by photo-electric conversion with the use of slight light are converted to voltage by a very small capacitance which is further output by using a source-follower transistor SF-Tr having a very small area. For this reason, it is necessary to remove noise generated when resetting the capacitance, manufacturing fluctuations of transistors, and other very small noise, therefore a difference between the reset level (VRST) and the luminance level (signal level: VSIG) for each pixel is output. In this way, in a CMOS image sensor, by outputting the difference between the reset level and the luminance level for each pixel, the reset noise and threshold fluctuation are removed, therefore signals of a few electrons can be detected. The operation of detecting this difference is called "CDS (correlated double sampling)" and is a widely used technique. All of the pixels arranged in the array are sequentially read by CDS, and 1 frame's worth of usual two-dimensional image data is output.

The solid-state imaging device 10 in the present embodiment is configured so that the operation for generating this usual two-dimensional image data can be performed in the usual operation mode MDU.

However, the signal processing circuit 70 in the present embodiment is configured so as to prevent unauthorized use or tampering, forgery, etc. of an image by generating a unique key from fluctuation information unique to the solid-state imaging device 10 (fluctuation information of pixels and readout circuit), combining the unique key and the acquisition data obtained from the solid-state imaging device 10 to generate discrimination data, combining this discrimination data with the image data and outputting the result, and preventing discrimination data from being correctly prepared when information concerning the unique key is not recognized.

The solid-state imaging device 10 in the present embodiment is configured so that the operation concerning the generation of this unique key can be performed in the key preparation mode MDK.

In the key preparation mode MDK in the present embodiment, a pixel fluctuation pattern (fluctuation information) which does not depend on peripheral luminance, but is unique to each chip is output as the unique ID. In this way, in the key preparation node MDK in the present embodiment, only the fluctuation pattern for each pixel is output. The luminance level is not output, therefore a pattern image which does not depend upon exposure conditions of the image sensor can be output. Further, the output of each pixel includes FPN and thermal noise which fluctuates at random for each frame. However, the FPN in the key preparation mode MDK is 10 times or more larger than the thermal noise, therefore a stable fixed fluctuation pattern can be output.

In the key preparation mode MDK in the present embodiment, at the time of generation of the unique key, the unique key is generated by using at least one of the fluctuation information of pixels and fluctuation information of the reading part as the key generation-use data. Further, in the first embodiment, at the time of generation of the unique key, the key generation-use data is processed to enhance the tamper resistance making the unique key difficult to break as tamper resistance enhancement processing. As will be explained later, in the first embodiment, decorrelated processing in the decorrelated processing part is performed on the key generation-use data so as to acquire decorrelated data weakened in correlation from the intercepted data correlated with the key generation-use data (for example image data processed by CDS), and the unique key is generated using the acquired decorrelated data. In the first embodiment, the data obtained by processing the intercepted data in the decorrelated processing part is not correlated with the decorrelated data.

Due to this, in the solid-state imaging device 10 of the first embodiment, it is possible to generate a unique key having a high confidentiality, becomes possible to secure a high tamper resistance of the unique key, and consequently becomes possible to reliably prevent tampering and forgery of an image.

Below, the characterizing configuration and functions of the solid-state imaging device 10 in the present embodiment will be explained focusing on so-called encryption processing for generating a unique key and combining discrimination data containing a unique key with image data.

Figure 4:
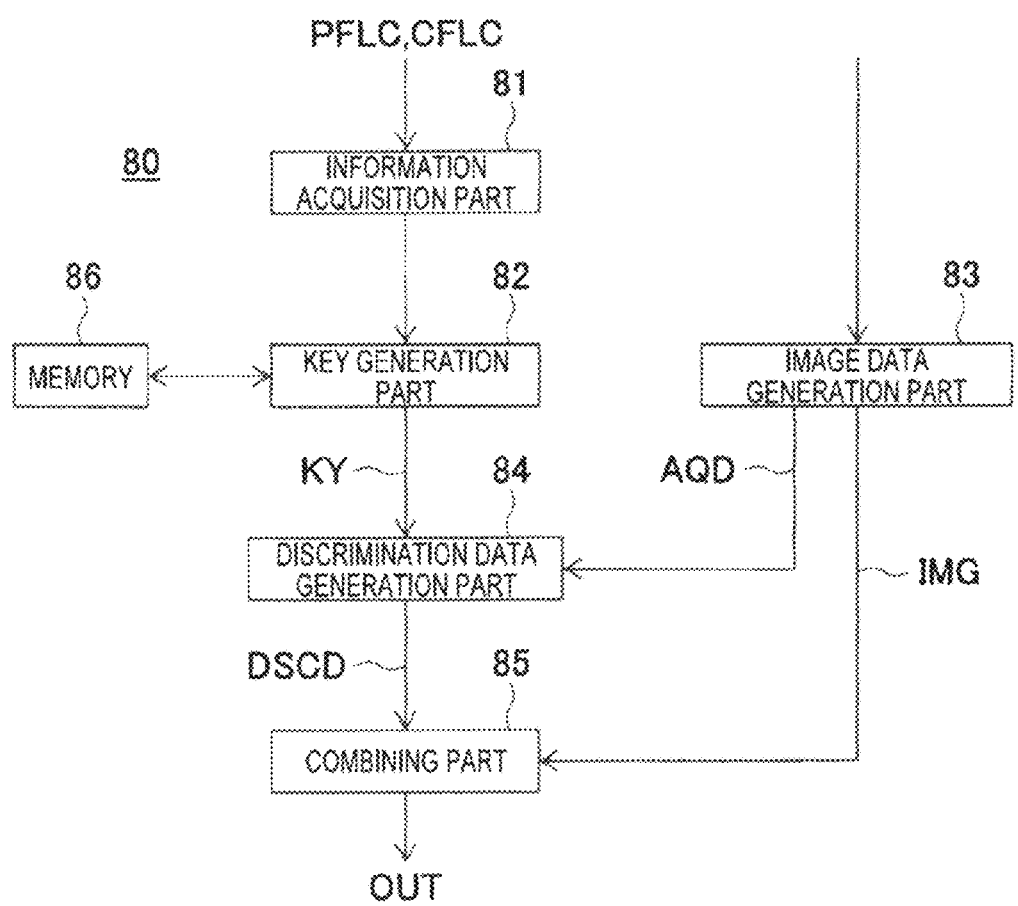
FIG. 4 is a block diagram showing an overall outline of an encryption processing system according to the first embodiment.

FIG. 4 is a block diagram showing an overall outline of an encryption processing system according to the first embodiment. FIG. 5 is a view schematically showing processing in the encryption processing system in FIG. 4.

An encryption processing system 80 in FIG. 4 has, as principal components, an information acquisition part 81, key generation part 82, image data generation part 83, discrimination data generation part 84, combining part 85, and memory 86. Note that, in the example in FIG. 4, the information acquisition part 81 and the key generation part 82 are configured as separate functional blocks. However, it is also possible to configure the information acquisition part 81 and key generation part 82 as one functional block.

The information acquisition part 81 acquires at least one of the fluctuation information PFLC of pixels PXL or the fluctuation information CFLC of the configuration circuits in the readout circuit 40 and supplies the acquired fluctuation information to the key generation part 82.

Here, as an example, the fluctuation information PFLC of pixels PXL will be explained in brief.

Regarding Fluctuation Information PFLC of Pixels PXL

First, the fluctuation information PFLC of pixels PXL will be explained. In the present embodiment, as the fluctuation information PFLC of pixels PXL, basically use is made of leak current and position information. Here, the reason why the leak current is employed will be explained.

Figure 6B:
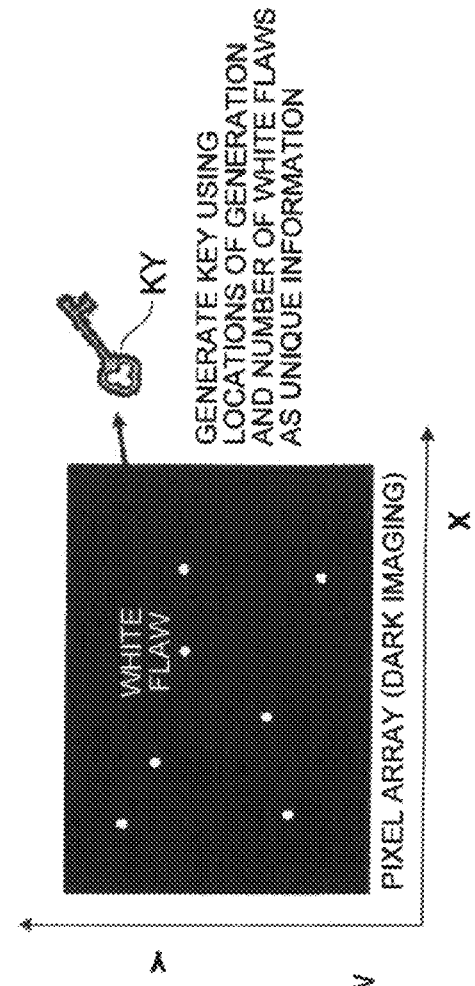
FIG. 6A and FIG. 6B are views for explaining a reason why a leak current is employed as the fluctuation information of pixels.
Figure 6A:
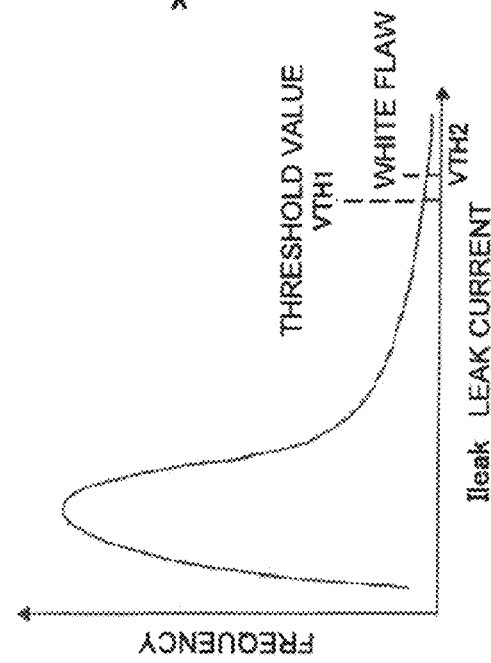

FIG. 6A and FIG. 6B are views for explaining the reason why the leak current is employed as the fluctuation information of pixels. FIG. 6A shows the distribution of strength of a pixel leak current, and FIG. 6B shows an example of distribution of location of white flaws.

In a sensor pixel of the solid-state imaging device 10, as shown in FIG. 6A, there is a leak current which cannot be 100% suppressed. A particularly extreme case (blown out in an instant even in dark field exposure) is referred to as a "white flaw" or "white point". This will be referred to as a "white flaw" below. Effort is made to reduce this white flaw in the solid-state imaging device 10 before shipping as much as possible. However, in the case of a white flaw which has not been completely suppressed, later image processing is used to compensate for the white flaw pixel by surrounding pixel data in the output of the image. Where in the pixel array this white flaw will appear cannot be learned unless fabricating the apparatus. In addition, it has reproducibility. For this reason, it can be regarded as information unique to a specimen. Therefore, in the present embodiment, as the fluctuation information PFLC of pixels PXL, use is made of a leak current and position information to generate a unique key KY. For example, as shown in FIG. 6B, it is possible to generate a unique key KY by using locations of occurrence (positions of occurrence) and number of white flaws as the unique information. The present embodiment uses this information as the unique key for encryption processing applying the PUF (physically unclonable function) technique used in the security field.

FIG. 7A and FIG. 7B are views showing an example of the amount of information per pixel. An amount H of information per pixel is given by the following equation:

$$H = -P0 \cdot \log_2(P0) - P1 \cdot \log_2(P1)$$

where, P0: probability of appearance of white flaw, and P1: probability of nonappearance of white flaw, i.e., 1−P0

For example, in a case of one million pixels (1E6), white flaw 100 ppm corresponds to 100 flaws and becomes as follows as the amount of information:

$$1.47E-3 \times 1E6 = 1.47E3 \text{ bit} = 1{,}470 \text{ bits}$$

Incidentally, the probability of occurrence of a white flaw per pixel, which is a factor necessary for key generation (from the security side), is given as follows:

$$100 \text{ to } 3{,}000 \text{ ppm} = 0.01\% \text{ to } 0.3\%$$

Next, the output and amount of information will be considered with reference to FIG. 8A and FIG. 8B and FIG. 9. FIG. 8A and FIG. 8B are views for explaining the output and amount of information in a case of nine elements. FIG. 9 is a view for explaining a biased output and amount of information in a case of 16 elements.

In the case of nine (3×3) elements, as shown in FIG. 8A, if 1 or 0 appears with a probability of ½ in each pixel, this output can be used as it is as the key, therefore this is effective as 9 bits' worth of key information. If 5 bits are necessary for error correction due to noise, as shown in FIG. 8B, the effective key information becomes 4 bits' worth, therefore this is output as 4 bits' worth of key information.

Next, the case of biased output by 16 (4×4) elements will be explained. In the case of 16 (4×4) elements, as shown in FIG. 9, in a case of a sample group wherein the probability of appearance of "1" in each element is ¹⁄₁₆ and "1" reliably appears somewhere in the elements, there are only 16 possible cases. Therefore, there are only 4 bits of information. For the amount of information of white flaws, by the same thinking, while the amount of information in a case where "1" or "0" appears with a probability of ½ in each of one million pixels is one million bits, the amount of information of white flaws, which are present in an amount of 100 ppm in one million pixels, becomes about 1,400 bits. An amount of information of this extent can be effectively utilized as a key.

The information acquisition part 81 for acquiring the pixel fluctuation information PFLC, as shown in FIG. 6A, acquires the leak information of pixels related to the threshold value VTH. In the case of the example shown in FIG. 6A and FIG. 6B, when the leak current Ileak is larger than the threshold value VTH1, a pixel can be judged as a white flaw. Further, the information acquisition part 81 may be set with a plurality of threshold values (VTH1 and VTH2 in the example in FIG. 6A). Information may also be differentiated in relation to the plurality of threshold values VTH1 and VTH2. Note that, it is also possible to change the threshold value VTH in accordance with the temperature or other aspects of the environment.

Further, the information acquisition part 81 can employ as the pixel fluctuation information PFLC the position information of a pixel exhibiting a certain level or more of a leak current. Further, the information acquisition part 81 can employ as the pixel fluctuation information PFLC a set of the top pixels in order of leak current. Further, the information acquisition part 81 can employ as the pixel fluctuation information PFLC addresses in the column direction and row direction of the set.

Leak Current of Photodiodes

The information acquisition part 81, for example, can employ the leak current of a photodiode PD as the leak current Ileak of a pixel.

FIG. 10A to FIG. 10D are views showing operation waveforms etc. of the principal parts in the usual operation mode and key preparation node in a case where the leak current of a photodiode PD is employed as the leak current Ileak of a pixel. FIG. 10A shows the operation waveforms at the time of the usual operation node MDU, FIG. 10B shows the operation waveforms in the key preparation mode MDK, FIG. 10C shows a key pattern image obtained by binarizing the fluctuation information, and FIG. 10D shows the relationships among the output signal, pixel number, and threshold value VTH. Note that, as explained before, in the present embodiment, the solid-state imaging device 10 is configured so that operation is possible in the usual operation mode MDU and the key preparation mode MDK.

In the usual operation mode MDU, as shown in FIG. 10A, the pixels PXL are reset in a state where the shutter is closed and are exposed while the shutter is opened. Further, signals are read out in a state where the shutter is closed.

In the key preparation mode MDK, as shown in FIG. 10B, the pixels are reset in a state where the shutter is closed and the pixel signals are read out after a constant time. In this case, the pixels are not exposed, therefore only the leak currents generated in the photodiodes PD are output as a unique key pattern. This unique key pattern, as shown in FIG. 10D, has maximum values due to heavy metal contamination etc., therefore has a high reproducibility.

Further, the information acquisition part 81 can employ as the pixel fluctuation information PFLC the information of the photodiodes in the non-effective pixel region other than the effective pixels in the pixel portion 20. FIG. 11A and FIG. 11B are views for explaining the employment of the information of the non-effective pixel region other than the effective pixels in the pixel portion 20 as the pixel fluctuation information PFLC.

Usually, the pixel portion 20, as shown in FIG. 11A, is configured including an effective pixel region 21 and a non-effective pixel region (OB: optical black region etc.) 22 on the periphery of the effective pixel region 21. Further, the non-effective pixel region (OB: optical black region etc.) 22, as shown in FIG. 11B, is shielded from light by a light-shielding film 23. In the present embodiment, by employing the information of white flaws and/or dark current in the pixel region other than the effective pixels, for example, the pixels in the OB pixel region 22, and using the sane as a key, it is possible to make detection of the key harder (special readout timing is needed for key detection).

Further, as the photodiodes (PD), buried photodiodes (BPD) have been widely used. On a substrate surface for forming the photodiodes (PD), there is a surface state due to dangling bonds and other defects. Therefore, a large charge (dark current) is generated by thermal energy, so it becomes impossible to read out a correct signal. In a buried photodiode (BPD), the charge accumulating part of the photodiode (PD) is buried in the substrate so as to reduce entry of a dark current into the signal. In a buried photodiode BPD, in the effective pixel region 21, a first conductivity type p+ layer 201 and a second conductivity type n+ layer 202 are formed from the surface side. In the present embodiment, in the OB region 22, as shown in FIG. 11B, it is also possible to remove a p-shield of the p+ layer on the photodiode PD surface to facilitate the generation of a dark current/white flaw (=key).

Further, in the present embodiment, the leak current of a photodiode PD fluctuates, therefore it is also possible to consider this fluctuation and add it to the information for key preparation. If considering the number of white flaws and other defects to be used as the key, for example, in the case of white flaws, there are later formed white flaws (white flaws which increase later) and white flaws which disappear. As a countermeasure against later formed flaws, a certain number of white flaws are designated as the key by designation of coordinates on the chip. As a countermeasure against disappearing white flaws, a larger number of white flaws than the minimum number of necessary white flaws is set in advance as the key. As a countermeasure against later formed flaws, further, flaws which fall in a specific output range are used as the key.

Configuration of Key Generation Part 82

The key generation part 82 (FIG. 4, FIG. 5, and FIG. 12) uses as the key generation-use data KYGD at least one of the fluctuation information of pixels which is acquired and supplied by the information acquisition part 81 and the fluctuation information of the readout circuit 40 to generate the unique key. The key generation part 82 supplies the generated unique key KY to the discrimination data generation part 84. The key generation part 82 generates the unique key KY in for example a period other than the time for reading effective pixels in the pixel portion 20 (for example blanking period).

Further, the key generation part 82 according to the first embodiment, when generating the unique key KY, processes the key generation-use data to enhance the tamper resistance for making the unique key difficult to break as tamper resistance enhancement processing.

Figure 12:
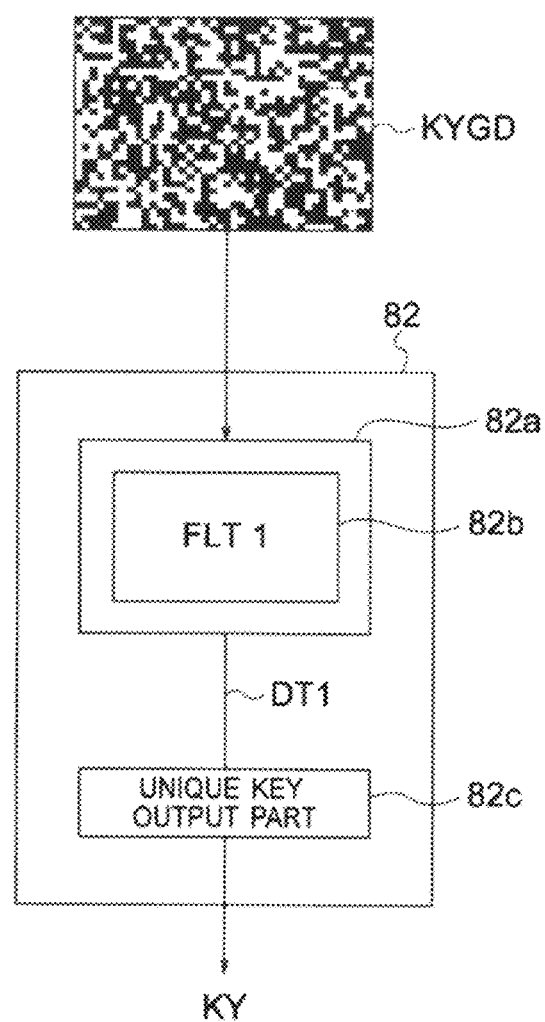
FIG. 12 is a block diagram showing an example of the configuration of principal parts of a key generation part according to the first embodiment.

FIG. 12 is a block diagram showing an example of the configuration of principal parts of the key generation part according to the first embodiment. In the key preparation node MDK in the present embodiment, the key generation part 82, when generating the unique key, uses at least one of the pixel fluctuation information PFLC and the fluctuation information CFLC of the reading part as the key generation-use data KYGD to generate the unique key. FIG. 12 shows an example of using the fluctuation information of pixels as the key generation-use data KYGD as an example.

Note that, in the key preparation mode MDK in the present embodiment, a pixel fluctuation pattern which does not depend upon the peripheral luminance and is unique to each chip (fluctuation information) is output as the unique ID. In this way, in the key preparation mode MDK in the present embodiment, only a pixel fluctuation pattern is output. The luminance level is not output, therefore it is possible to output a pattern image which does not depend upon the exposure conditions of the image sensor. Further, the output of each pixel contains FPN and thermal noise which fluctuates at random for each frame. However, the FPN in the key preparation mode MDK is 10 times or more larger than the thermal noise, therefore a stable fixed fluctuation pattern can be output.

Further, the first embodiment includes a tamper resistance enhancement processing part 82a which, at the time of generation of the unique key, processes the key generation-use data KYGD to enhance the tamper resistance for making the unique key difficult to break as tamper resistance enhancement processing. The tamper resistance enhancement processing part 82a includes a decorrelation processing part 82b for performing decorrelation processing with respect to the key generation-use data KYGD for acquiring first data DT1 of decorrelated data weakened in correlation from the intercepted data ITCD correlated with the key generation-use data KYGD. In the first embodiment, second data DT2 obtained by processing the intercepted data ITCD in the decorrelation processing part 82b is not correlated with the first data DT1 of decorrelated data.

In the first embodiment, the key generation-use data KYGD is generated in relation to the pixel signals read out by the reading part 90. This is data not correlated with the intercepted data ITCD when extracting pixels with values showing correlation (for example code values) within a first range RG1, while is data correlated with the intercepted data ITCD when extracting pixels in a second range RG2 outside of the first range RG1. Further, the decorrelation processing part 82b includes a filter FLT1 which extracts from the key generation-use data KYGD only the pixel data with values showing correlation falling in the first range RG1 as first data DT1 of decorrelated data.

The key generation part 82 has a unique key output part 82c which applies error correction, hash, or other information processing with respect to the first data DT1 of decorrelated data output from the filter FLT1 to generate and output the final unique key.

By providing the key generation part 82 having the above configuration, the solid-state imaging device 10 in the first embodiment can generate a unique key having a high confidentiality, can secure a high tamper resistance of the unique key, and consequently can reliably prevent tampering and forgery of an image.

Here, the reason for provision of the filter FLT1 which extracts from the key generation-use data KYGD only pixel data with values showing correlation falling in the first range RG1 as first data DT1 of decorrelated data and an example of the characteristics thereof will be explained.

Figure 14:
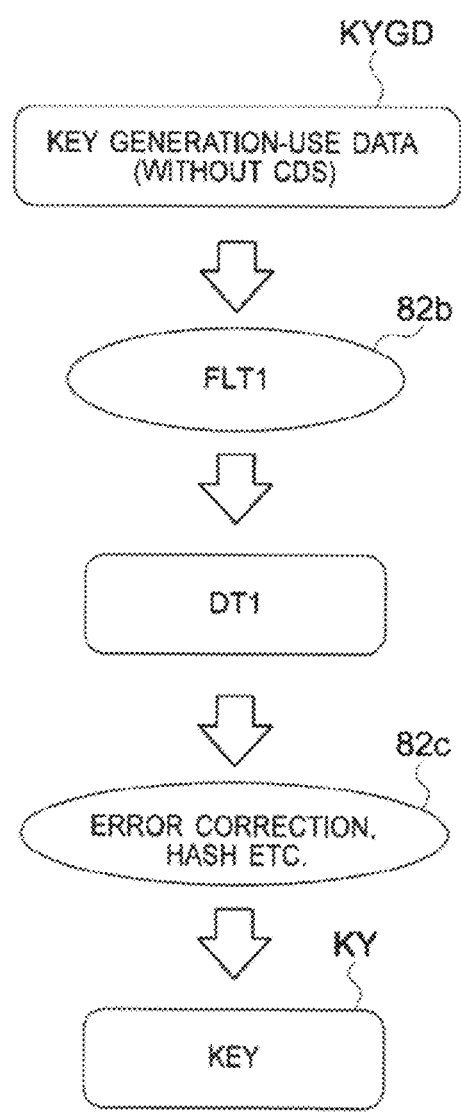
FIG. 14 is a view showing a flow of processing for generating a unique key through a filter according to the first embodiment.
Figure 15B:
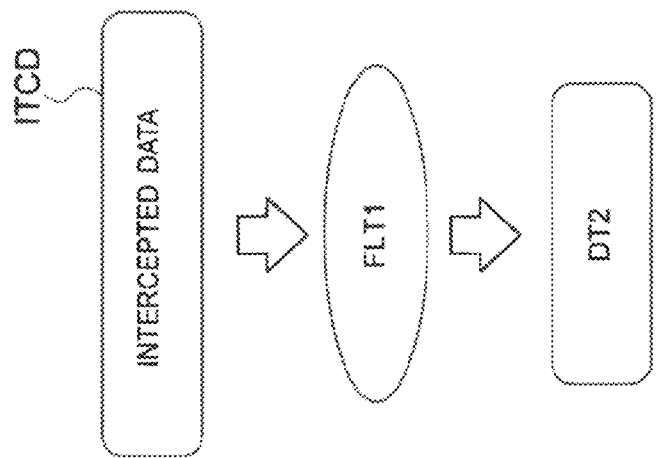
FIG. 15A and FIG. 15B are views for explaining the characteristics that a filter according to the first embodiment should have.
Figure 15A:
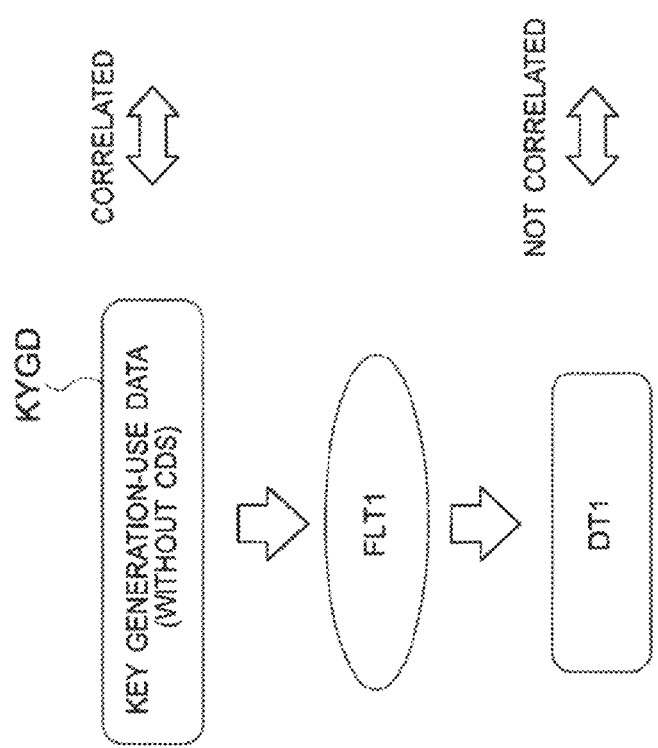

FIG. 13A and FIG. 13B are views for explaining the issues in the method for generating a unique key. FIG. 14 is a view showing the flow of processing of generating a unique key through a filter according to the first embodiment. FIG. 15A and FIG. 15B are views for explaining the characteristics that the filter according to the first embodiment should have.

As shown in FIG. 13A, as the method for generating a unique key KY, for example, consider an example of applying certain information processing to key generation-use data KYGD of image data not subjected to CDS processing. At this time, when applying error correction or hash or other information processing, as shown in FIG. 13B, the possibility arises that the key can be easily reproduced if the intercepted data ITCD, which is data having a strong correlation with the key generation-use data KYGD, falls into the wrong hands. The confidentiality of the key cannot be kept in this case. Therefore, in the first embodiment, as shown in FIG. 14, provision is made of a decorrelation processing part 82b constituted by a filter FLT1 given a certain characteristic, the key generation-use data is input to this filter FLT1, and information processing such as error correction or hash processing is applied in the unique key output part 82c with respect to the obtained output of the first data DT1 of decorrelated data to thereby generate a unique key KY. In this case, by suitably selecting the characteristic of the filter, it becomes possible to prevent replication of the key even if the intercepted data ITCD falls into the wrong hands.

The characteristic that the filter FLT1 should have will be considered next. As shown in FIG. 15B, if the second data DT2 obtained by inputting the intercepted data ITCD correlated with the key generation-use data KYGD to the filter FLT1 is not correlated with the first data DT1 obtained by inputting the key generation-use data KYGD to the filter FLT1, the requirement of the filter is satisfied. This is because the key can be correctly reproduced from the first data DT1 while the key cannot be replicated from the second data DT2.

As shown in FIG. 15A and FIG. 15B, the requirement of the filter FLT1 is satisfied so far as the second data DT2 obtained by inputting the intercepted data ITCD correlated with the key generation-use data KYGD to the filter FLT1 is not correlated with the first data DT1. However, in order to realize such a filter, it is necessary to learn in advance what correlation exists between the key generation-use data KYGD and the intercepted data ITCD from evaluation of the actual apparatus and so on.

Below, a concrete example for realizing the filter FLT1 will be explained. Here, the explanation is predicated on the correlation characteristics between the key generation-use data KYGD and the intercepted data ITCD being known by evaluation of the actual apparatus.

First, assume that it is known that the correlation characteristics between the key generation-use data KYGD and the intercepted data ITCD are as follows:

(1) When extracting pixels with code values of the key generation-use data KYGD from "a" to "b" in the first range RG1, the correlation with the intercepted data ITCD is "0.00".

(2) When extracting pixels with code values of the key generation-use data KYGD in a second range RG2 outside of the range from "a" to "b" of the first range RG1, the correlation with the intercepted data ITCD is "0.02".

At this time, the following can be mentioned as an embodiment of the filter 1. Just pixel data with code values within the range from "a" to "b" in the first range RG1 extracted from the key generation-use data KYGD is used as the filter output (first data DT1).

Note that, as the parameters when investigating the correlation characteristics between the key generation-use data KYGD and the intercepted data ITCD, there can be illustrated not only the code values, but also the following other parameters:

A. Spatial frequency (component after discrete cosine transform)
B. Specific bit string (for example, exclusion of three or more successive "0" or three or more successive "1")
C. Moving average or coefficient of FIR filter or the like The key generation part 82 generates a key by a fuzzy extractor for strengthening the reproducibility of the key. A "fuzzy extractor" is a processor designed to issue the same output with respect to input which is stable to a certain extent.

Figures 16A, 16B:
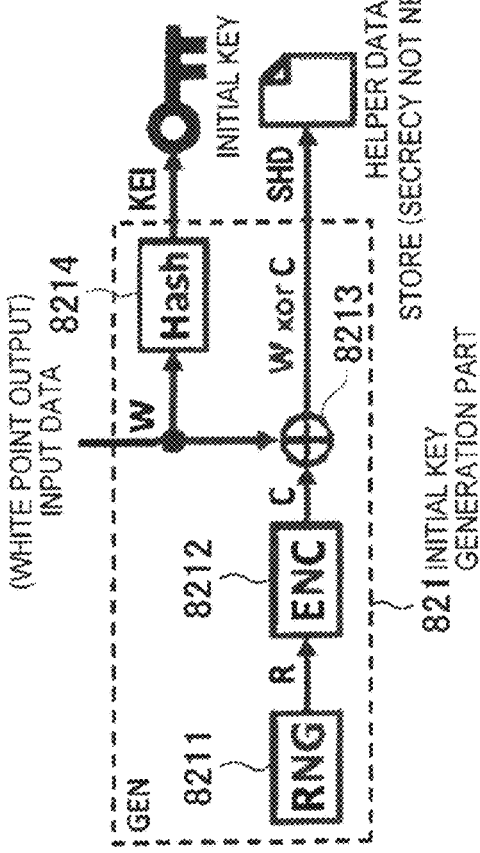
FIG. 16A and FIG. 16B are views showing an example of the configuration of a fuzzy extractor which can be applied to a unique key output part in the key generation part according to the present embodiment.

FIG. 16A and FIG. 16B are views showing an example of the configuration of a fuzzy extractor which can be applied to the unique key output part in the key generation part according to the present embodiment. The fuzzy extractor 820 in the present example has an initial key generation part 821 shown in FIG. 16A and a key regeneration part 822 shown in FIG. 16B.

The initial key generation part 821, as shown in FIG. 16A, is configured including a ring oscillator (RNG) 8211, encryption part (ENC) 8212, exclusive OR circuit (XOR) 8213, and hash part 8214.

In the initial key generation part 821, the fluctuation information of pixels related to for example white flaw output which is acquired by the information acquisition part 81 is input as the input data W (for example first data DT1) to the XOR 8213 and hash part 8214. In the hash part 8214, an initial key KYI is generated based on the input data W. This initial key KYI is supplied to the discrimination data generation part 84. This initial key KYI is written into the memory 86 as for example key data at the time of shipping. For example, it is also possible to configure this part so that the initial key data is written into an electronic fuse (efuse) or other memory capable of being cut by for example software to guarantee the reproducibility of the key data.

Further, in the initial key generation part 821, an oscillation output signal R of the ring oscillator 8211 is encrypted by the encryption part 8212. That encrypted data C is supplied to the XOR 8213. In the XOR 8213, an exclusive OR is taken between the input data W and the encrypted data C. Due to this, helper data SHD (WxorC) is generated. This helper data SHD (WxorC), unlike the key data, does not have to be concealed and is stored in the memory 86. The helper data SHD stored in the memory 86 is used as the base data of regeneration of the key in the key regeneration part 822.

The key regeneration part 822, as shown in FIG. 16B, includes an exclusive OR circuit (XOR) 8221, decoding part (DEC) 8222, encryption part (ENC) 8223, exclusive OR circuit (XOR) 8224, and hash part 8225. Note that, the decoding part (DEC) 8222 and encryption part (ENC) 8223 function as the error correction part.

In the key regeneration part 822, input data W' (first data DT1) containing the fluctuation information of pixels related to for example white flaw output which is acquired by the information acquisition part 81 and the helper data SHD (WxorC) stored in the memory 86 are input to the XOR 8221. The helper data SHD (WxorC) is input to the XOR

8224 as well. In the XOR 8221, the exclusive OR is taken between the input data W' and the helper data WxorC, and the result is supplied as the data C' to the decoding part 8222. In the decoding part 8222, processing for decoding the data C' is carried out whereby the decoded data /R is generated. The decoded data /R is supplied to the encryption part 8223. The decoded data /R is encrypted by the encryption part 8223, and that encrypted data /C{=(WxorC)xorW' } is supplied to the XOR 8224. In the XOR 8224, the exclusive OR is taken between the encrypted data /C and the helper data WxorC, and the result is input as the data /W{= (WxorC)xor/C} to the hash part 8225. Further, in the hash part 8225, the regeneration key KY is generated based on the input data /W{=(WxorC)xor/C}. This regeneration key KY is supplied to the discrimination data generation part 84. If there is a little noise in the input data W' and the data C' can be corrected, the result becomes /C=C and /W=W, therefore the key is regenerated.

Note that, an example in which the key generation part 82 described above generated the unique key based on the fluctuation information of the pixels or readout circuit 40 was explained, but it is also possible to configure this part so that unique keys generated according to different fluctuation information are processed to obtain a final unique key. For example, it is also possible to configure the part as follows.

That is, the key generation part 82 may also, for example, includes a first function of generating a first unique key by using the fluctuation information of the ADC 41, amplifier (AMP) 42, or S/H circuit 43 in the readout circuit 40 and a second function of generating a second unique key by using the output of the SRAM of the column memory 45 of the readout circuit 40 and be configured to generate a final unique key by computing the first unique key generated according to the first function and the second unique key generated according to the second function.

This configuration can be applied in the same way for the fluctuation information of pixels.

The image data generation part 83 generates for example two-dimensional image data IMG as shown in FIG. 5 by predetermined signal processing with respect to the read-out signals which are read out through the readout circuit 40 in the usual readout mode and are subjected to predetermined processing. The image data generation part 83 supplies the generated image data IMG to the combining part 85.

The image data generation part 83 supplies the acquisition data AQD acquired from the solid-state imaging device 10 to the discrimination data generation part 84. Here, the acquisition data AQD is at least one data among the data concerning pixels, date, temperature, and GPS (global positioning system).

The discrimination data generation part 84 combines the unique key KY generated in the key generation part 82 and the acquisition data AQD acquired in the present solid-state imaging device 10 to generate the discrimination data DSCD. The discrimination data generation part 84 supplies the generated discrimination data DSCD to the combining part 85.

The combining part 85, as shown in FIG. 5, combines the discrimination data DSCD generated in the discrimination data generation part 84 and the image data IMG based on the reading data of the image data generation part 83 and outputs the result as the final output of the sensor chip. The combining part 85, for example as shown in FIG. 5, combines the data so that the sequence of the combined data becomes header HD, discrimination data DSCD, and image data IMG.

As explained above, in the encryption processing system 80, the unique key KY is generated from fluctuation information unique to the solid-state imaging device 10 (fluctuation information of pixels and readout circuit), the unique key KY and the acquisition data AQD obtained from the solid-state imaging device 10 are combined to generate the discrimination data DSCD, and this discrimination data DSCD is combined with the image data IMG and output. Therefore, when information concerning the unique key is not recognized, correct discrimination data cannot be prepared. Therefore, when an image is altered or the like, the alteration is seen, so it becomes difficult to forge an image.

Note that, the combining part 85 may be configured so as to include a function of hierarchically masking the image portion by using the key information to be combined. Further, the combining part 85 may be configured so as to include a function of forming an electronic watermark in the image by using the key information to be combined.

In the solid-state imaging device 10 having the above configuration, the operation at the time of the key preparation node in the encryption processing system 80 is substantially as follows. Here, as an example, the operation in the case explained related to FIG. 10A to FIG. 10D where the leak current of a photodiode PD is employed as the leak current Ileak of a pixel will be explained.

In the key preparation mode MDK, as shown in FIG. 10B, the pixels are reset in the state where the shutter is closed and the pixel signals are read out after a constant time. In this case, the pixels are not exposed, therefore only the leak currents generated in the photodiodes PD are output as the unique key pattern.

This unique information is acquired as the fluctuation information PFLC in the information acquisition part 81 and is supplied to the key generation part 82. In the key generation part 82, the unique key KY is generated by using the fluctuation information of pixels which is acquired and supplied by the information acquisition part 81. Specifically, in the key generation part 82, when generating the unique key, the tamper resistance enhancement processing part 82a processes the key generation-use data KYGD to enhance the tamper resistance for making the unique key difficult to break as tamper resistance enhancement processing. In the tamper resistance enhancement processing part 82a, by the decorrelation processing with respect to the key generation-use data KYGD in the decorrelation processing part 82b, the first data of the decorrelated data weakened in correlation is acquired from the intercepted data ITCD correlated with the key generation-use data KYGD.

Here, the key generation-use data KYGD is generated related to the pixel signals read out by the reading part 90. This is the data not correlated with the intercepted data ITCD when extracting pixels with values showing correlation (for example code values) falling in the first range RG1 while is data correlated with the intercepted data ITCD when extracting the pixels in the second range RG2 outside of the first range RG1. Further, by the filter FLT1 in the decorrelation processing part 82b, only such pixel data with values showing correlation falling in the first range RG1 is extracted from the key generation-use data KYGD as the first data DT1 of decorrelated data. Further, in the unique key output part 82c, error correction, hash, or other information processing are applied to the first data DT1 of the decorrelated data output from the filter FLT1, whereby the final unique key is generated and output. Further, in the key generation part 82, the generated unique key KY is supplied to the discrimination data generation part 84. Note that, in the key generation part 82, the unique key KY is generated in for example a period other than the time for reading effective pixels in the pixel portion 20.

In the discrimination data generation part 84, the unique key KY generated in the key generation part 82 and the acquisition data AQD acquired in the solid-state imaging device 10 are combined to generate the discrimination data DSCD. In the discrimination data generation part 84, the generated discrimination data DSCD is supplied to the combining part 85.

In the combining part 85, the discrimination data DSCD generated in the discrimination data generation part 84 and the image data IMG based on the reading data by the image data generation part 83 are combined. The result is output as the final output of the sensor chip.

As explained above, in the first embodiment, the signal processing circuit 70 generates two-dimensional image data by predetermined signal processing with respect to the read-out signals which are read out by the readout circuit 40 and are subjected to the predetermined processing. However, in the first embodiment, in order to prevent unauthorized use or tampering, forgery, etc. of an image, the encryption processing system 80 is configured so that it generates a unique key KY from fluctuation information unique to the solid-state imaging device 10 (fluctuation information of pixels and readout circuit), combines the unique key KY and the acquisition data AQD obtained from the solid-state imaging device 10 to generate the discrimination data DSCD, carbines this discrimination data DSCD with the image data IMG, and outputs the result, thereby preventing correct preparation of the discrimination data when information concerning the unique key KY is not recognized.

In the key preparation mode MDK of the first embodiment, pixel fluctuation pattern (fluctuation information) which does not depend upon the peripheral luminance and is unique for each chip is output as the unique ID. In this way, in the key preparation node MDK of the first embodiment, only the pixel fluctuation pattern is output. The luminance level is not output, therefore a pattern image not depending upon the exposure conditions of the image sensor can be output. Further, the output of each pixel contains FPN and thermal noise which fluctuates at random for each frame. However, the FPN in the key preparation mode MDK is 10 times or more larger than the thermal noise, therefore a stable fixed fluctuation pattern can be output.

In the key preparation mode MDK of the first embodiment, at the time of generation of the unique key, use is made of at least one of fluctuation information of pixels and fluctuation information of the reading part as the key generation-use data to generate a unique key. Further, in the first embodiment, at the time of generation of the unique key, the key generation-use data is processed to enhance the tamper resistance making the unique key difficult to break as tamper resistance enhancement processing. In the first embodiment, decorrelated data which is weakened in correlation by decorrelation processing of the key generation-use data in the decorrelation processing part is acquired from the intercepted data correlated with the key generation-use data. The unique key is generated by using the acquired decorrelated data. In the first embodiment, the data which is obtained by processing the intercepted data in the decorrelation processing part is not correlated with the decorrelated data.

Due to this, in the solid-state imaging device 10 of the first embodiment, it is possible to generate a unique key having a high confidentiality, it becomes possible to secure a high tamper resistance of the unique key, and consequently it becomes possible to reliably prevent tampering and forgery of an image.

Note that, in the present embodiment, a configuration where the components in the solid-state imaging device 10 are mounted in the same package can be employed.

In an SiP (Silicon in Package) where the solid-state imaging device (CIS) 10 and the ISP (image signal processor) are sealed in the same package, it is possible to employ a configuration finishing the signal processing for generating the key and discrimination data inside the package and to generate discrimination data without outputting the unique key data to the outside of the package.

Further, in an SoC (system on chip) provided with an image sensor and signal processing circuit, it is possible to employ a configuration completing the signal processing for generating the key and discrimination data inside the chip and to generate discrimination data without outputting the unique key data to the outside of the chip.

Further, the solid-state imaging device 10 in the present embodiment can be configured so that a driving timing for accumulating a leak current etc. over a long time is provided separately from the usual read drive timing as explained before. Further, it is also possible to reduce full-scale voltage of the analog amplifier, digital amplifier, or ADC, emphasize the accumulated voltage of the leak voltage, and output the result. Further, it is also possible to reduce the random noise component by averaging or adding the data in a plurality of rows or frames.

Note that, the above embodiment was explained by taking as an example the leak current of a photodiode PD as the fluctuation information of pixels employed by the information acquisition part 81. However, as will be shown below, it is possible to employ a leak current other than the leak current of the photodiode PD, a threshold voltage, and so on. For example, the information acquisition part 81 can employ the leak current of floating diffusion FD as the leak current Ileak of pixel. Further, the information acquisition part 81 can employ the fluctuation information of a threshold value Vth of the source-follower transistor SF as the fluctuation information of pixels.

Further, for the fluctuation information CFLC of the configuration circuits of the readout circuit 40, the information acquisition part 81 can employ the fluctuation information of an ADC as the fluctuation information CFLC of the configuration circuits of the readout circuit 40. Further, the information acquisition part 81 can employ the fluctuation information of an amplifier (AMP) as the fluctuation information CFLC of the configuration circuits of the readout circuit 40. Further, the information acquisition part 81 can employ the fluctuation information of an S/H circuit as the fluctuation information CFLC of the configuration circuits of the readout circuit 40. Further, the information acquisition part 81 can employ the output (fluctuation) information of the SRAM of the column memory as the fluctuation information CFLC of the configuration circuits of the readout circuit 40.

Second Embodiment

Figure 17:
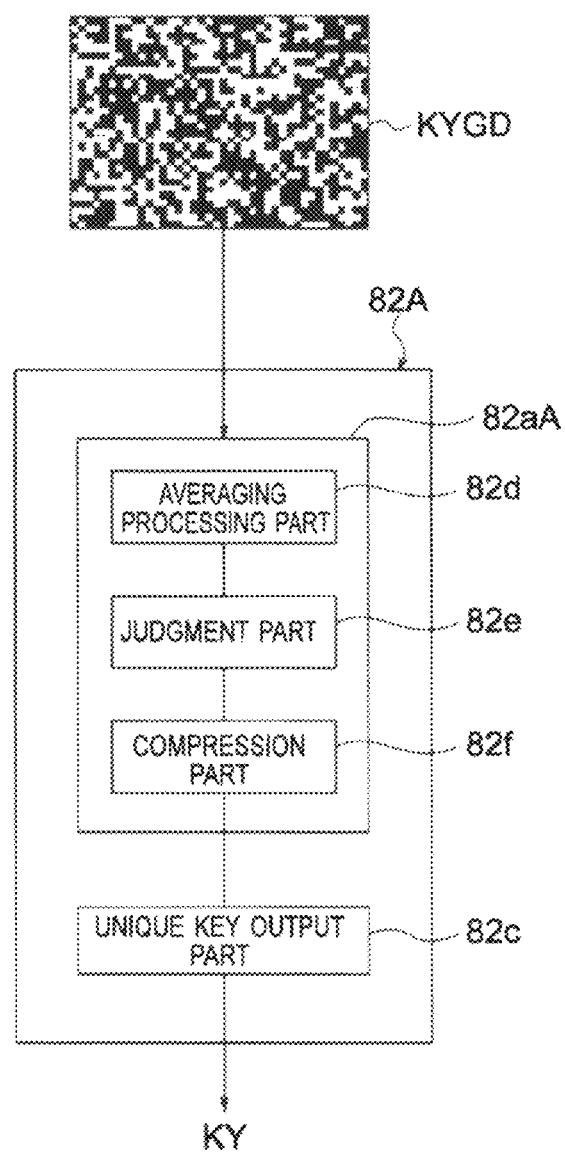
FIG. 17 is a block diagram showing an example of the configuration of principal parts of a key generation part according to a second embodiment of the present invention.

FIG. 17 is a block diagram showing an example of the configuration of principal parts of the key generation part according to a second embodiment of the present invention.

The difference of the key generation part 82A according to the second embodiment from the key generation part 82 in the first embodiment resides in the configuration of the tamper resistance enhancement processing part. In the tamper resistance enhancement processing part 82aA in the key generation part 82A according to the second embodiment, in place of providing the filter FLT1 for performing decorrelation processing, the part is configured so as to perform signal processing for raising the reproducibility and uniqueness of the fluctuation signal.

In the key preparation mode MDK in the present embodiment, only the reset level for each pixel is output. The luminance level is not output, therefore a pattern image not depending upon the exposure conditions of the image sensor can be output. Further, the output of each pixel contains FPN and thermal noise which fluctuates at random for each frame. However, the FPN in the key preparation mode MDK is 10 times or more large than the thermal noise, therefore a stable fixed fluctuation pattern can be output.

In the encryption processing system 80 arranged in the signal processing circuit 70, the unique ID is prepared after reducing or removing the random noise or the fixed pattern fluctuation spatially having a low frequency from the fixed fluctuation pattern. Random noise lowers the reproducibility of the unique ID, while fixed pattern fluctuation spatially having a low frequency reduces the uniqueness of the unique ID. For this reason, the key generation part 82A according to the second embodiment employs a configuration improved by the signal processing. In the second embodiment, for example, in the case of an image sensor having 2 million pixels, the fluctuation pattern signal of one frame contains about 1 million SF transistor fluctuations, therefore a 1/0 string of about 500,000 bits can be prepared.

The tamper resistance enhancement processing part 82aA in the key generation part 82A in FIG. 17 has an averaging processing part 82d which performs averaging processing between two vertical pixels in the key generation-use data KYGD in order to raise the reproducibility of the fluctuation signal, a judgment part 82e for judging the magnitude (subtraction or the like) between the two vertical pixels to binarize the data in order to improve the uniqueness of the fluctuation pattern, and a data compression part 82f for compressing the data.

Figure 18:
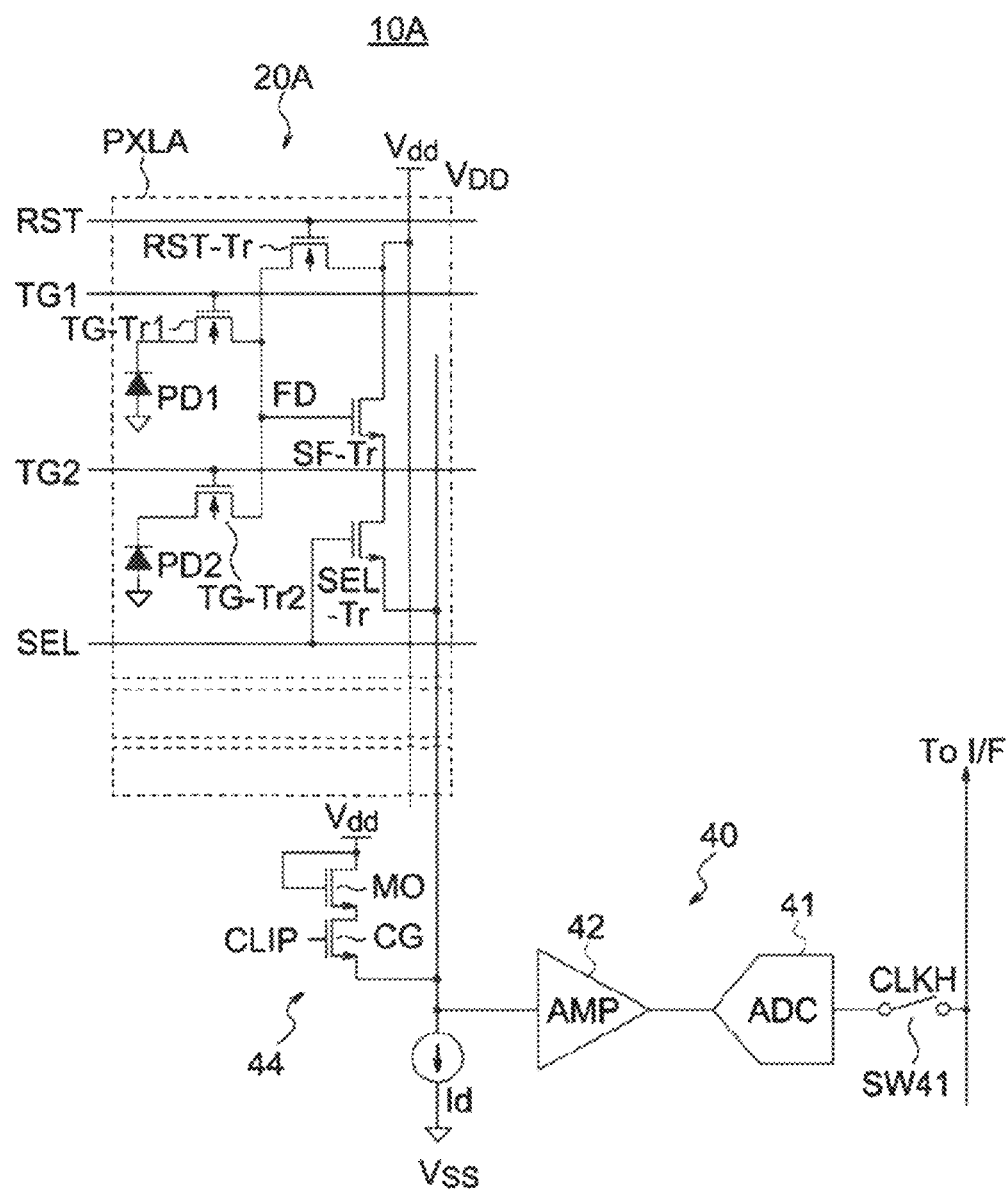
FIG. 18 is a view showing an outline of a pixel portion and a column readout circuit which is arranged for each column according to the second embodiment.

FIG. 18 is a view showing the pixel portion and the column readout circuit arranged for each column according to the second embodiment in brief.

A pixel portion 20A in FIG. 18 has a pixel sharing structure wherein one floating diffusion FD and one source-follower element constituted by the source-follower transistor SF-Tr, one reset element constituted by the reset transistor RST-Tr, and one selection element constituted by the selection transistor SEL-Tr are shared by a plurality of (in this example, two) photo-electric conversion elements constituted by photodiodes PD1 and PD2 and transfer elements constituted by transfer transistors TG-Tr1 and TG-Tr2.

That is, a pixel PXLA in the CMOS image sensor according to the second embodiment is configured by the photodiodes PD1 and PD2, the transfer transistors TG-Tr1 and TG-Tr2 driven by the transfer clocks of the control signals TG1 and TG2, the reset transistor RST-Tr driven by the reset clock of the control signal RST, the source-follower (SF) transistor SF-Tr, and the selection transistor SEL-Tr driven by the selection clock of the control signal SEL. Here, the two photodiodes PD1 and PD2 share the reset transistor RST-Tr, source-follower (SF) transistor SF-Tr, and selection transistor SEL-Tr. This system has been widely used for fine pixels in recent years. By sharing transistors among the photodiodes PD, the photodiodes PD can be made larger in area relative to a predetermined element size and the region capable of photo-electric conversion can be extended, thus the detection sensitivity with respect to the incident light is raised.

In a pixel with the selection transistor SEL-Tr turned on, the power supply line VDD of the power supply voltage Vdd, source-follower (SF) transistor SF-Tr, and current source Id become serial, therefore a source-follower circuit is configured. By this source-follower circuit, the voltage of the floating diffusion FD is input through the AMP 42 in the readout circuit 40 to the ADC 41 and is converted to a digital signal. The result is output through a switch SW41 driven by a control signal CLKH to an interface circuit. Further, a clip circuit 44 is arranged at the end of the pixel array, and a clip gate CG driven by a clip clock of a control signal CLIP and a diode-connected transistor MO are arranged at the end of the pixel array. These are used for restricting the pixel output voltage amplitude and thereby enabling stable operation.

Here, an outline of the operations in the usual operation mode MDU and key preparation mode MDK in the solid-state imaging device 10A according to the second embodiment will be explained with reference to FIG. 19A to FIG. 19F and FIG. 20A to FIG. 20F. FIG. 19A to FIG. 19F are views showing operation waveforms of principal parts in the usual operation mode MDU in the solid-state imaging device 10A according to the second embodiment. FIG. 20A to FIG. 20F are views showing operation waveforms of principal parts in the key preparation mode MDK in the solid-state imaging device 10A according to the second embodiment.

Operation in Usual Operation Mode MDU

In the usual operation mode MDU, as shown in FIG. 19A to FIG. 19F, the control signal SEL of the n-th row is changed to the H level whereby a row is selected. Next, when the control signal RST of the selected row is the H level, the floating diffusion FD is reset. The reset voltage VRST (Vrst) is output from the source-follower through the vertical signal line LSGN, is held in the later stage ADC 41 at the time t1, and is converted to a digital form. The electrons which are photo-electrically converted and accumulated the photodiode PD1 pass through the transfer transistor TG-Tr1 when the control signal TG1 is the H level, are transferred to the floating diffusion FD, and are converted to voltage. The signal voltage VSIG (Vsig) at this time is output by the source-follower, and is held in the later stage ADC 41 at the time t2, and converted to a digital form. Reading is carried out in the sane way for the photodiode PD2. Here, the input/output characteristics of the source-follower circuit are represented by the following equation:

$$V_{out} = V_{in} - V_{gs} = V_{in} - V_{th} - \Delta V_{th} - \sqrt{\frac{2I_d}{\beta}} \quad (1)$$

Where, Vgs, Vth, ΔVth, β, and Id represent the voltage between the gate and the source, the threshold voltage of the source-follower (SF) transistor SF-Tr, the substrate bias voltage, a coefficient proportional to the transistor size, and a bias current. These differ for each of the transistors due to manufacturing fluctuations, therefore the pixel output voltage ends up fluctuating for each pixel. However, by taking a difference between the reset signal (reset level) and the luminance signal (signal level) by CDS processing, an offset component in the fluctuation can be removed. The CDS output is represented by the following equation:

$$V_{CDS} = V_{RST} - V_{gs,RST} - (V_{SIG} - V_{gs,SIG}) \quad (2)$$
$$\approx A(V_{RST} - V_{SIG})$$

Where, A indicates the gain of the source-follower circuit. A gain fluctuation of each pixel remains. However, it becomes the difference between the reset level VRST and the luminance level (signal level) VSIG, that is, a coefficient proportional to the luminance, therefore it becomes possible to detect even a minute signal in darkness.

Operation in Key Preparation Mode MDK

In the key preparation mode MDK, by omitting the above CDS, the fluctuation of each pixel is output. Here, by reading the pixels using the clip pixel output as the reference level, the fluctuation pattern can be output without changing the circuit operation in the AMP 42 and following circuits.

In the key preparation mode MDK, as shown in FIG. 20A to FIG. 20F, first the control signal CLIP is changed to the H level and the clip circuit 44 is selected. The source-follower (SF) transistor MO in the clip circuit 44 is short-circuited to the power supply line VDD of the power supply voltage Vdd, therefore the power supply voltage Vdd is output through the source-follower, held in the later stage ADC 41 at the time t11, and is converted to a digital form. Next, the control signal SEL in the n-th row is changed to the H level whereby a row is selected. At the same time, the control signals RST and TG1 of the selected row are changed to the H level whereby the photodiode PD1 and floating diffusion FD are reset. This is for preventing electrons overflowing from the photodiode PD1 to the floating diffusion FD at the time of high luminance from detection. Here, the floating diffusion FD is short-circuited to the power supply line VDD of the power supply voltage Vdd by the reset transistor RST-Tr, therefore the power supply voltage Vdd is output through the source-follower, held in the later stage ADC 41 at the time t12, and is converted to a digital form.

The later stage circuits operate in the same way as the usual operation mode MDU and output the difference between the clip signal and the pixel reset signal. However, in the key preparation mode MDK, the difference of decorrelated signals is output. Therefore, this is called differential double sampling (DDS). The DDS output is represented by the following equation:

$$V_{DDS} = V_{dd} - V_{gs0,Vdd} - (V_{dd} - V_{gs,Vdd}) \quad (3)$$
$$= V_{gs,Vdd} - V_{gs0,Vdd}$$
$$= (V_{th} - V_{th0}) + (\Delta V_{th,Vdd} - \Delta V_{th0,Vdd}) + \left(\sqrt{\frac{2I_d}{\beta}} - \sqrt{\frac{2I_d}{\beta_0}}\right)$$

Here, Vgs0, Vth0, ΔVth0, and β0 indicate the gate-source voltage of the clip circuit 44 and source-follower (SF) transistor, the threshold value of the SF transistor, the substrate bias voltage, and a coefficient proportional to the transistor. From the above, it is possible to output just the Vth and ΔVth and β fluctuations of pixels based on the clip circuit 44. By performing this operation with respect to all pixels, manufacturing fluctuations of element characteristics of 2 million pixels etc. can be extracted.

On the other hand, Vth0, β0, and Id are components of the clip circuit 44 and current source which are common to the different columns. The manufacturing fluctuations of these become fluctuation components unique to each column. Accordingly, the DDS output becomes a signal where the fluctuation components unique to each column are superimposed on fluctuations unique to each pixel. Due to the fluctuation components unique to each column, the randomness of the fluctuation signal pattern in the pixel array ends up falling.

Figure 21:
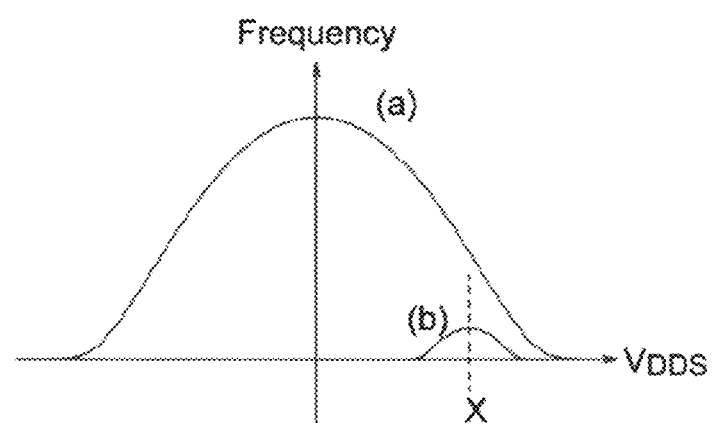
FIG. 21 is a view showing a distribution of fluctuations of pixel characteristics of an entire pixel array and column in the solid-state imaging device according to the second embodiment.

FIG. 21 is a view showing the distributions of fluctuations of pixel characteristics of an entire array and a column in the solid-state imaging device according to the second embodiment.

For example, as shown in FIG. 21, assume that the clip circuit 44 in the Xi-th column shows a voltage larger than the mean value due to manufacturing fluctuations. The DDS output in the pixel group in the X-th column shows a fluctuation distribution (b) of pixels having the fluctuation voltage unique to that column as a center value. Many of the pixels in the X-column show outputs larger than the center value in the fluctuation distribution (a) in the entire pixel array. Accordingly, when judging 1/0 of the fixed pattern of the pixels by the magnitude with respect to the center value of the entire pixel array, most pixels in the X-column are judged as "1", therefore the diversity of the fixed pattern is lost. For example where the fluctuation of the clip circuit 44 is more dominant than the pixel fluctuation, for example, even in a pixel array having 2 million pixels, the same fluctuation pattern is repeated in all rows, therefore the number of fluctuation patterns is determined by the horizontal pixel number 2000. Accordingly, it is necessary to remove this fluctuation component unique to each column. Therefore, in the second embodiment, signal processing for removing the fluctuation component unique to each column is carried out in the key generation part 82A in the signal processing circuit 70. Next, this signal processing method will be explained.

Figure 22A:
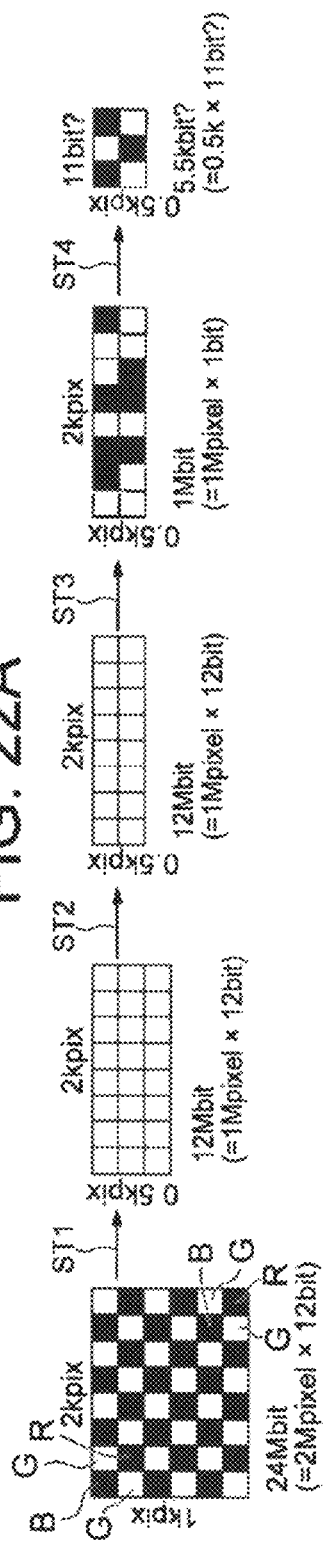
FIG. 22A and FIG. 22B are views showing an outline of signal processing for removing a fluctuation component unique to each column which is carried out in the key generation part in the signal processing circuit according to the second embodiment.
Figure 22B:
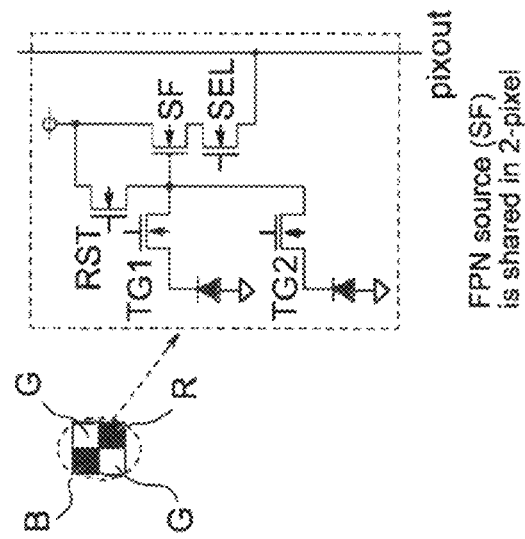
Figure 23:
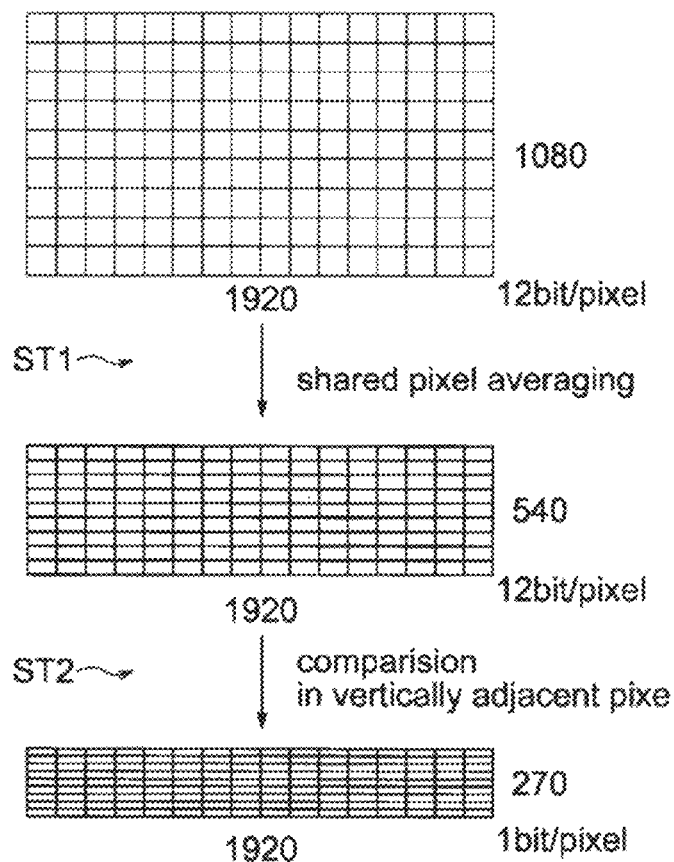
FIG. 23 is a view showing the outline of signal processing for removing a fluctuation component unique to each column which is carried out with respect to a pixel array of FHD (1920×1080 pixels) in the key generation part in the signal processing circuit according to the second embodiment.
Figure 24:
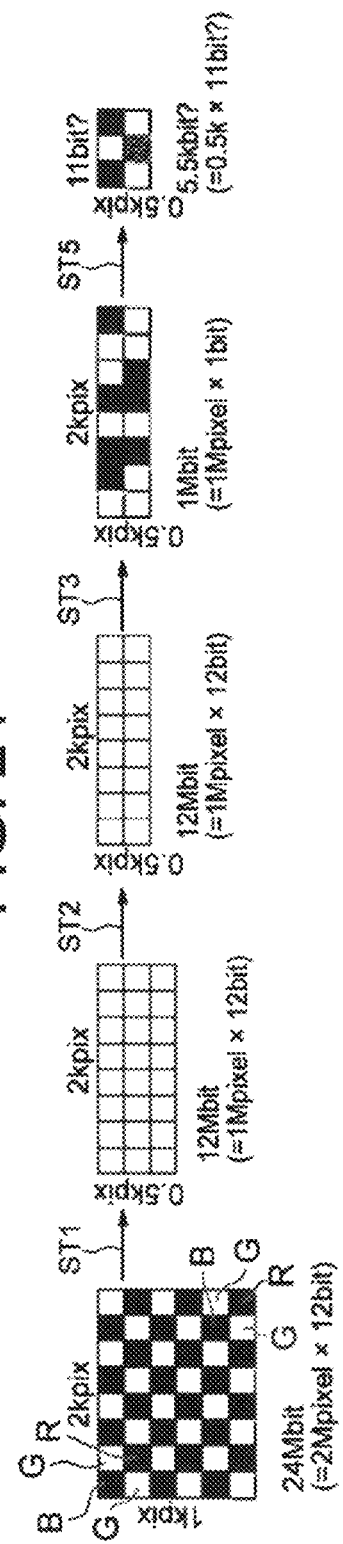
FIG. 24 is a view showing an outline of another signal processing for removing a fluctuation component unique to each column which is carried out in the signal processing circuit according to the second embodiment.

FIG. 22A and FIG. 22B are views showing the outline of signal processing for removing the fluctuation component unique to each column which is carried out in the key generation part in the signal processing circuit according to the second embodiment. FIG. 23 is a view showing the outline of signal processing for removing the fluctuation component unique to each column which is carried out with respect to the FHD (1920×1080 pixels) pixel array in the key generation part in the signal processing circuit according to the second embodiment. FIG. 24 is a view showing the outline of other signal processing for removing the fluctuation component unique to each column which is carried out in the key generation part in the signal processing circuit according to the second embodiment.

Outline of Signal Processing

As shown in FIG. 22A and FIG. 22B and FIG. 23, in the pixel array, for example, FHD (1920×1080 pixels) pixel array, the DDS output of each pixel is converted to a 12 bit digital signal. First, the averaging processing part 82*d* performs averaging processing between the two vertical pixels in the reading direction sharing the source-follower (SF) transistor SF-Tr (ST1). The SF transistor SF-Tr and clip circuit 44 are common between the two vertical pixels, therefore the fluctuation signal component does not change. However, the noise generated from each transistor can be reduced to 1/√2, therefore the reproducibility of the fluctuation signal can be raised. As a result, the array data size becomes (1920×540 pixels).

Next, the judgment part 82*e* judges the (1920×540 pixels) array after averaging processing for magnitude between two vertical pixels to binarize the data (ST2, ST3). The DDS output difference between a pixel in the i-th column and j-th row and a pixel in the i-th column and (j+1)-th row is represented by the following equation:

$$\Delta_{i,j} \equiv V_{DDS,i,j} - V_{DDS,i,j+1} \quad (4)$$

$$= V_{th,i,j} - V_{th,i,j+1} + \Delta V_{th,i,j} - \Delta V_{th,i,j+1} + \sqrt{\frac{2I_{d,i}}{\beta_{i,j}}} - \sqrt{\frac{2I_{d,i}}{\beta_{i,j+1}}}$$

From Equation (4), the bias current component Id.i unique to each column remains. However, by removing the components of the threshold voltage and substrate bias voltage which are unique to each column, the uniqueness of the fluctuation pattern can be improved. Further, the difference in parameters of the adjacent transistors is output, therefore at the time of manufacture, fluctuation occurring over a wide area can be removed, so local fluctuation becomes dominant. Therefore, the randomness of the fluctuation pattern can be improved in the sane way. The above signal processing can be realized with a small circuit scale by sequentially processing the data for each four rows without holding all of the data in the entire pixel array.

Note that, after the processing at step ST3, as shown in FIG. 17, the compression part 82f may perform compression processing (ST4). In the example in FIG. 22A, it is possible to restrict the number of rows to reduce the data down to 128 bits or 256 bits.

Alternatively, as at step ST5 in FIG. 24, sorting processing may be carried out as well. For example, the absolute values in the rows are sorted in order from the largest one down and are judged for 1/0 according to whether certain upper significant bits are positive or negative. The reproducibility is improved since use is made of pixels having a large fluctuation difference.

Note that, it is also possible to configure the apparatus so as to use a black defect countering pixel to output a difference between the offset of the source-follower transistor SF-Tr and the offset of a dummy source-follower transistor of the black defect countering pixel (see PLT 1). A control voltage of the black defect countering pixel is suitably set so that the output code will not become stuck. Due to this, it becomes possible to improve the uniqueness of the key.

Further, the other shared structure pixels may also be subjected to averaging processing in the averaging processing part 82d. For example, in a four-pixel shared structure, the averaging processing is carried out between the pixels sharing the source-follower transistor SF-Tr. A structure not shared by pixels as well may also be subjected to the same signal processing. At this time, the averaging processing part 82d is omitted, and the processing of the judgment part 82e and the following parts is carried out.

Note that, it is also possible to configure the apparatus so as to perform the decorrelation processing according to the first embodiment (decorrelation processing through the filter FLT1) after performing the tamper resistance enhancement processing according to the second embodiment explained above. Due to this, not only can the reproducibility and uniqueness of the unique ID be improved, but also it becomes possible to generate a unique key having a high confidentiality, it is possible to secure a higher tamper resistance of the unique key, and consequently it is possible to reliably prevent tampering and forgery of an image.

Simulation Result

In each of the usual operation node MDU and key preparation mode MDK, circuit simulation was executed. A Monte Carlo simulation was carried out by using the column circuit shown in FIG. 18 and fluctuation of each was computed. Here, for the capturing mode, darkness is assumed.

Figure 25:
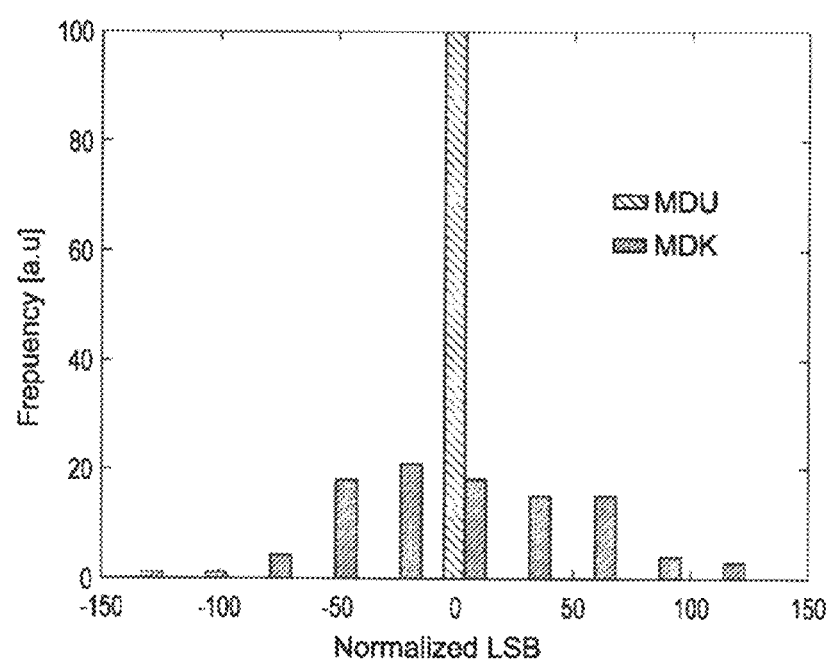
FIG. 25 is a view showing the results of Monte Carlo simulation.

FIG. 25 is a view showing results of Monte Carlo simulation. In the usual operation node MDU, the fluctuation of the CDS output is 0.5 LSB, therefore it is seen that the fluctuation component of each pixel can be removed. On the other hand, in the key preparation mode MDK, the fluctuation of the CDS output is 50.9 LSB, therefore it is seen that the fluctuation component of each pixel can be detected. Further, the result of simulation of the later stage circuit noise was 1.2 LSB. Accordingly, the SN ratio of the fluctuation signal becomes 32.6 dB. This is sufficiently large relative to random noise, therefore a high reproducibility of the unique ID can be expected.

Measurement Results

Here, the measurement results will be simply explained in brief. The measurement environment was as follows: Using a CMOS image sensor having 2 million pixels, image data in the usual operation node MDU and key preparation mode MDK are fetched into a personal computer (PC). The CMOS image sensor is operated with 12-bit output and 60 fps. Further, the CMOS image sensor is mounted on a camera board and is connected to the PC by using a USB. A drive timing control register of the image sensor is transferred from the PC through the USB to the camera board, and the operation timing in the capturing mode and PUF node is switched. Also the image data of the image sensor output is fetched into the PC through the USB. The characteristic signal processing in the second embodiment explained above was executed on the PC.

Figure 26A:
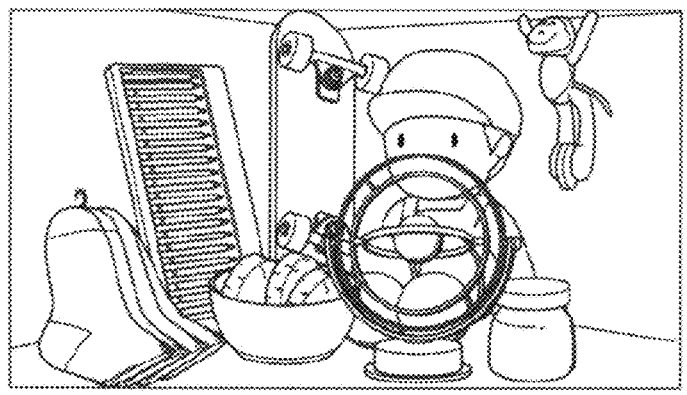
FIG. 26A to FIG. 26C are views showing acquisition images acquired in predetermined environments.
Figure 26B:
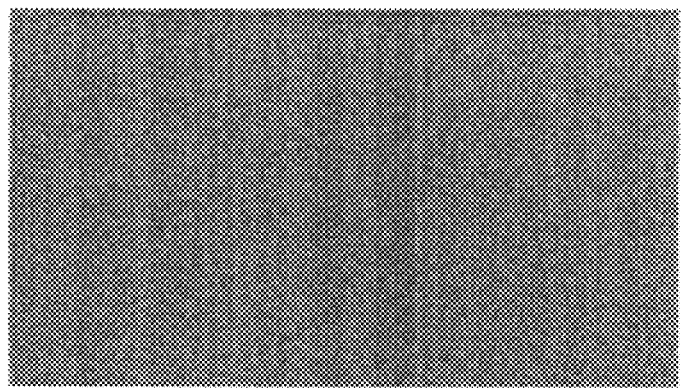
Figure 26C:
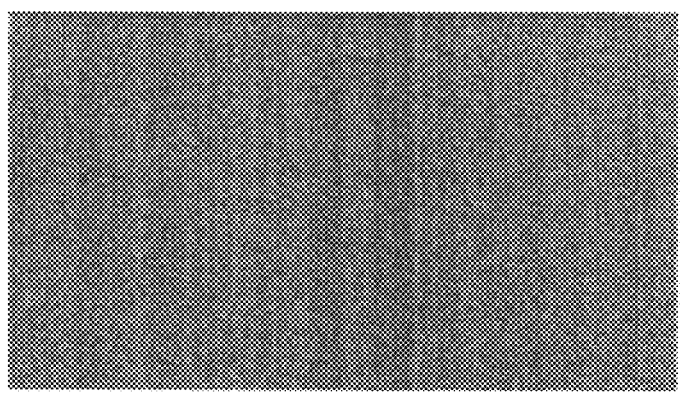

FIG. 26A to FIG. 26C are views showing acquired images acquired in the predetermined environment. FIG. 26A shows the image output of the usual operation node MDU. The noise can be removed by the CDS operation, and the target can be captured. FIG. 26B shows the image output obtained when switching to the key preparation node MDK in brightness under the same luminance environment. By changing the drive timing of the CMOS image sensor, only fluctuation signals can be acquired. Further, FIG. 26C shows the image output of the key preparation mode MDK in darkness obtained by shielding the sensor board from light. It is seen that the same fluctuation signals as those in FIG. 26B can be acquired without depending on the peripheral luminance.

In order to confirm the influence of the peripheral luminance upon the fluctuation signals, 100 each images in FIGS. 26B and 26C were acquired, the images were averaged, and the influence of the random noise was reduced. Next, the signal processing was executed for each 100-averaged image, and the result was converted to a 1/0 bit string. For these two bit strings, a bit inversion ratio was computed. It was confirmed that the inversion ratio was a sufficiently small 0.086%. It could be confirmed from this result that a pixel fluctuation pattern not depending upon the peripheral luminance could be acquired.

Figure 27A:
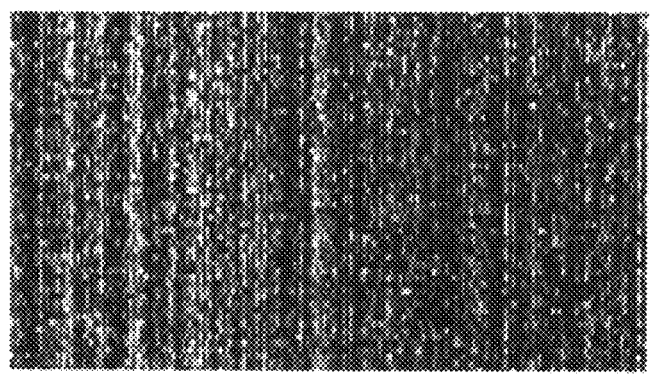
FIG. 27A and FIG. 27B are views showing characteristics resulting from the removal of the fluctuation component unique to each column.
Figure 27B:

FIG. 27A and FIG. 27B are views showing the characteristics after removal of the fluctuation component unique to each column. FIG. 27A is a view obtained by enlarging and emphasizing a portion of the image in the key preparation mode MDK. It is seen that the FPN component of each column is superimposed on the fluctuation signal of each pixel. Here, the column FPN obtained by computing the standard deviation relative to the center value of each column and the pixel fluctuations obtained by computing the standard deviation relative to the value of each pixel were 35.9 LSB and 62.1 LSB. On the other hand, FIG. 27B shows an image obtained by executing the signal processing shown in FIG. 22 to FIG. 24 on the image shown in FIG. 27A. As a result of this, the column FPN became 1.2 LSB, and the pixel fluctuation became 34.0 LSB, therefore 96.7% of the column FPN was removed. It can be confirmed that the column FPN was ⅛ or less relative to the pixel fluctuation, so is sufficiently reduced.

Figure 28:
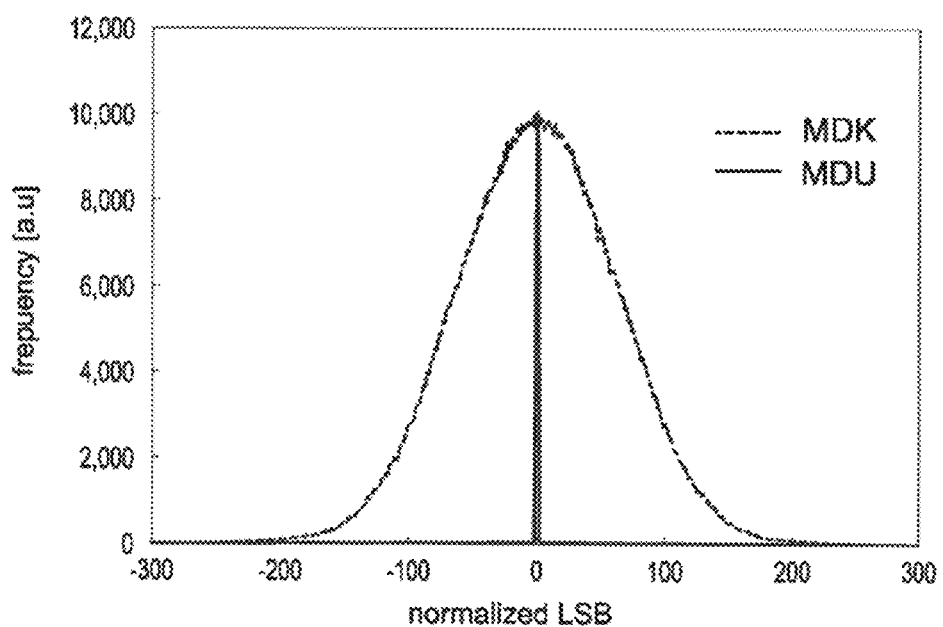
FIG. 28 is a view showing an output distribution at the time of darkness in each of the usual operation mode and key preparation mode.

FIG. 28 is a view showing output distributions in darkness in the usual operation mode and key preparation mode. In the usual operation mode MDU performing CDS, the standard deviation is a sufficiently small 0.82 LSB. On the other hand, in the key preparation mode MDK, the standard deviation is a sufficiently large 62.1 LSB and further shows a normalized distribution, therefore it can be confirmed that random fluctuation can be extracted.

The solid-state imaging devices 10 and 10A explained above can be applied as imaging devices to a digital camera or video camera, portable terminal, monitoring camera, camera for medical endoscope, or other electronic apparatus.

Figure 29:
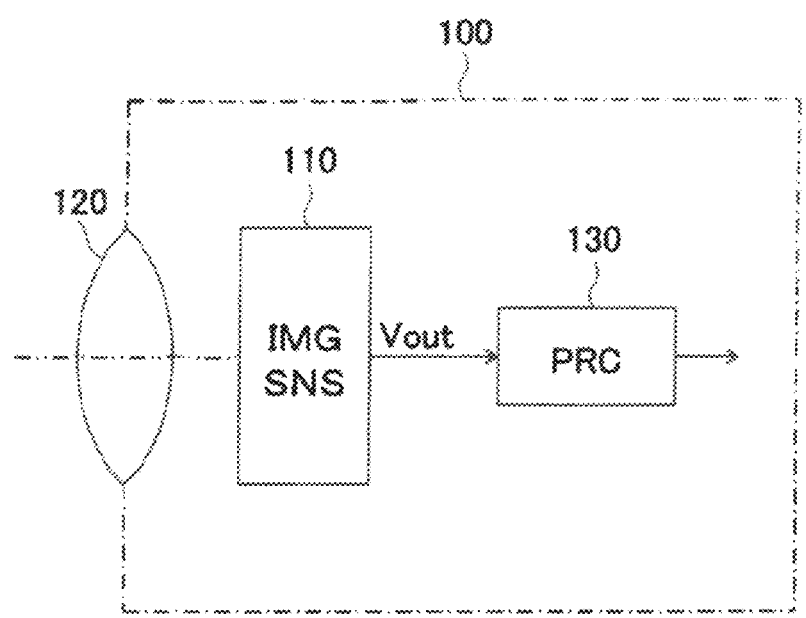
FIG. 29 is a view showing an example of the configuration of an electronic apparatus to which a solid-state imaging device according to the embodiment of the present invention is applied.

FIG. 29 is a view showing an example of the configuration of an electronic apparatus mounting a camera system to which the solid-state imaging device according to an embodiment of the present invention is applied.

The present electronic apparatus 100, as shown in FIG. 29, has a CMOS image sensor (IMGSNS) 110 to which the solid-state imaging devices 10 and 10A according to the present embodiment can be applied. Further, the electronic apparatus 100 has an optical system (lens etc.) 120 for guiding incident light (forming a subject image) into the pixel region of this CMOS image sensor 110. The electronic apparatus 100 has a signal processing circuit (PRC) 130 for processing the output signal of the CMOS image sensor 110.

The signal processing circuit 130 applies predetermined signal processing to the output signal of the CMOS image sensor 110. The image signal processed in the signal processing circuit 130 can be projected as a moving picture on a monitor configured by a liquid crystal display or the like or can be output to a printer. Further, it may be directly recorded in a memory card or other storage media. Various aspects are possible.

As explained above, by mounting the solid-state imaging device 10 or 10A explained before as the CMOS image sensor 110, it becomes possible to provide a high performance, small-size, and low cost camera system. Further, electronic apparatuses used for applications with restrictions due to the requirements of installation of cameras such as mounting size, number of connectable cables, cable lengths, and installation heights such as monitoring cameras, cameras for medical endoscopes, etc. can be realized.

The invention claimed is:

1. A solid-state imaging device comprising
A pixel portion in which a plurality of pixels each including a photodiode are arranged in rows and columns,
a reading part for reading pixel signals from the pixel portion, and
a key generation part which generates a unique key by using, as key generation-use data, at least one of fluctuation information of the pixels and fluctuation information of the reading part, wherein
the key generation part includes a tamper resistance enhancement processing part for processing the key generation-use data to enhance the tamper resistance for making the unique key difficult to break as tamper resistance enhancement processing.

2. The solid-state imaging device as set forth in claim 1, wherein the tamper resistance enhancement processing part in the key generation part includes a decorrelation processing part for performing decorrelation processing with respect to the key generation-use data for acquiring decorrelated data weakened in correlation from intercepted data correlated with the key generation-use data and
generates the unique key by using the acquired decorrelated data.

3. The solid-state imaging device as set forth in claim 2, wherein the data obtained by processing the intercepted data in the decorrelation processing part is not correlated with the decorrelated data.

4. The solid-state imaging device as set forth in claim 2, wherein:
the key generation-use data is generated related to a pixel signal read out by the reading part, is data not correlated with the intercepted data when extracting a pixel with a value showing correlation within s first range, and is data correlated with the intercepted data when extracting a pixel in a second range outside of the first range, and
the decorrelation processing part includes a filter for extracting from the key generation-use data, as the decorrelated data, only pixel data with values showing correlation falling in the first range.

5. The solid-state imaging device as set forth in claim 1, wherein the tamper resistance enhancement processing part in the key generation part includes an averaging processing part for performing averaging processing on a plurality of pixels of the key generation-use data.

6. The solid-state imaging device as set forth in claim 5, wherein the tamper resistance enhancement processing part in the key generation part includes a judgment part for judging magnitude between two adjacent pixels and binarizing the data in the data subjected to the averaging processing in the averaging processing part.

7. The solid-state imaging device as set forth in claim 6, wherein the tamper resistance enhancement processing part in the key generation part includes a compression part for compressing the output data of the judgment part.

8. The solid-state imaging device as set forth in claim 6, wherein the tamper resistance enhancement processing part in the key generation part includes a sorting part for sorting the output data of the judgment part.

9. The solid-state imaging device as set forth in claim 1, wherein the key generation part uses a leak current and position information as the fluctuation information of the pixels.

10. The solid-state imaging device as set forth in claim 1, wherein a pixel includes
a photo-electric conversion element for accumulating a charge generated by photo-electric conversion in an accumulation period,
a transfer element capable of transferring the charge accumulated in the photo-electric conversion element in a transfer period,
a floating diffusion to which the charge accumulated in the photo-electric conversion element is transferred through the transfer element,
a source-follower element for converting the charge in the floating diffusion with a gain in accordance with the charge amount, and
a reset element for resetting the floating diffusion to a predetermined potential.

11. The solid-state imaging device as set forth in claim 5, wherein the pixel portion has a pixel sharing structure sharing one floating diffusion, one source-follower element, and one reset element among a plurality of photo-electric conversion elements and transfer elements.

12. The solid-state imaging device as set forth in claim 11, wherein a clip circuit for restricting the pixel output voltage amplitude is arranged at the end of the pixel array.

13. A method for driving a solid-state imaging device including a pixel portion in which a plurality of pixels each including a photodiode are arranged in a matrix and a reading part for reading pixel signals from the pixel portion, comprising
   an information acquisition step of acquiring at least one information of fluctuation information of the pixels and fluctuation information of the reading part and
   a key generation step of generating a unique key by using the fluctuation information acquired in the information acquisition step as key generation-use data and,
   in the key generation step, processing the key generation-use data for enhancing the tamper resistance for making the unique key difficult to break as tamper resistance enhancement processing.

14. The method for driving the solid-state imaging device as set forth in claim 13, wherein the tamper resistance enhancement processing in the key generation step
   performs decorrelation processing with respect to the key generation-use data for acquiring decorrelated data weakened in correlation from intercepted data correlated with the key generation-use data and
   generates the unique key by using the acquired decorrelated data.

15. The method for driving the solid-state imaging device as set forth in claim 13, wherein the tamper resistance enhancement processing in the key generation step
   performs averaging processing between two pixels which are adjacent in the reading direction of the key generation-use data and
   judges magnitude between the two adjacent pixels to binarize the data in the data subjected to the averaging processing.

16. An electronic apparatus comprising
   a solid-state imaging device and
   an optical system for forming a subject image in the solid-state imaging device, wherein
   the solid-state imaging device has
   a pixel portion in which a plurality of pixels each including a photodiode are arranged in a matrix,
   a reading part for reading pixel signals from the pixel portion, and
   a key generation part which generates a unique key by using, as key generation-use data, at least one of fluctuation information of the pixels and fluctuation information of the reading part, and
   the key generation part includes a tamper resistance enhancement processing part for processing the key generation-use data to enhance the tamper resistance for making the unique key difficult to break as tamper resistance enhancement processing.

* * * * *